US 9,820,407 B2

(12) United States Patent
Sakamoto et al.

(10) Patent No.: US 9,820,407 B2
(45) Date of Patent: Nov. 14, 2017

(54) ELECTRONIC DEVICE AND COOLING SYSTEM

(71) Applicant: NEC Corporation, Tokyo (JP)

(72) Inventors: Hitoshi Sakamoto, Tokyo (JP); Minoru Yoshikawa, Tokyo (JP); Akira Shoujiguchi, Tokyo (JP); Masaki Chiba, Tokyo (JP); Kenichi Inaba, Tokyo (JP); Arihiro Matsunaga, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/768,917

(22) PCT Filed: Feb. 19, 2014

(86) PCT No.: PCT/JP2014/000840
§ 371 (c)(1),
(2) Date: Aug. 19, 2015

(87) PCT Pub. No.: WO2014/132591
PCT Pub. Date: Sep. 4, 2014

(65) Prior Publication Data
US 2016/0014928 A1 Jan. 14, 2016

(30) Foreign Application Priority Data
Feb. 26, 2013 (JP) ................. 2013-035781

(51) Int. Cl.
*H05K 7/20* (2006.01)
*G06F 1/20* (2006.01)

(52) U.S. Cl.
CPC ........... *H05K 7/20145* (2013.01); *G06F 1/20* (2013.01); *H05K 7/202* (2013.01); *H05K 7/205* (2013.01); *H05K 7/20154* (2013.01)

(58) Field of Classification Search
CPC ........... H05K 7/202; H05K 7/205; G06F 1/20
(Continued)

(56) References Cited

U.S. PATENT DOCUMENTS 6,575,230 B1 * 6/2003 Kadota ............... F28D 15/0233
165/104.21
2001/0042614 A1 * 11/2001 Okamoto .............. F25B 23/006
165/104.21

(Continued)

FOREIGN PATENT DOCUMENTS

EP 2 506 694 A1 10/2012
JP 2002-158475 A 5/2002

(Continued)

OTHER PUBLICATIONS

English translation for Yoshio reference.*
International Search Report corresponding to PCT/JP2014/000840, dated Mar. 18, 2014 (5 pages).

*Primary Examiner* — Dion R Ferguson
*Assistant Examiner* — Mandeep S Buttar
(74) *Attorney, Agent, or Firm* — Wilmer Cutler Pickering Hale and Dorr LLP

(57) ABSTRACT

An electronic board 200 has a heat generating component 220 mounted on it. An enclosure 300 houses the electronic board 200. A heat transport unit 400 is coupled to the enclosure 300 and transports heat generated by the heat generating component 220 to the outside. A heat receiving unit 510 is provided in a heat transport unit 400, 400A. The heat receiving unit 510 receives heat generated by the heat generating component 220. A heat dissipating unit 530 is provided in the heat transport unit 400 in such a manner that a portion of the heat dissipating unit 530 is exposed to outside air, and is coupled to the heat receiving unit 510. The heat dissipating unit 530 dissipates heat received by the heat receiving unit 510 to the outside. A guide duct unit 340 is (Continued)

formed into a tube interconnecting the heat generating component 220 and the heat receiving unit 510 in order to release heat of the heat generating component 220 to the heat receiving unit 510. This enables the heat generating component on the electronic board to be efficiently cooled with a small and simple configuration.

10 Claims, 17 Drawing Sheets

(58) Field of Classification Search
 USPC .................................................. 361/690, 696
 See application file for complete search history.

(56) References Cited

U.S. PATENT DOCUMENTS

| | | | | |
|---|---|---|---|---|
| 2007/0171614 | A1* | 7/2007 | Pedoeem | ................ H04L 12/18 |
| | | | | 361/695 |
| 2012/0234034 | A1 | 9/2012 | Nakano et al. | |
| 2014/0321056 | A1* | 10/2014 | Yoshikawa | ........ H05K 7/20818 |
| | | | | 361/697 |

FOREIGN PATENT DOCUMENTS

| | | |
|---|---|---|
| JP | 3348552 B2 | 9/2002 |
| JP | 2004-158641 A | 6/2004 |
| JP | 2010-160533 A | 7/2010 |
| JP | 2011-114051 A | 6/2011 |
| JP | 2012-023141 A | 2/2012 |

\* cited by examiner

VIEW ON ARROW J

VIEW ON ARROW K

VIEW ON ARROW B

VIEW ON ARROW C

VIEW ON ARROW D

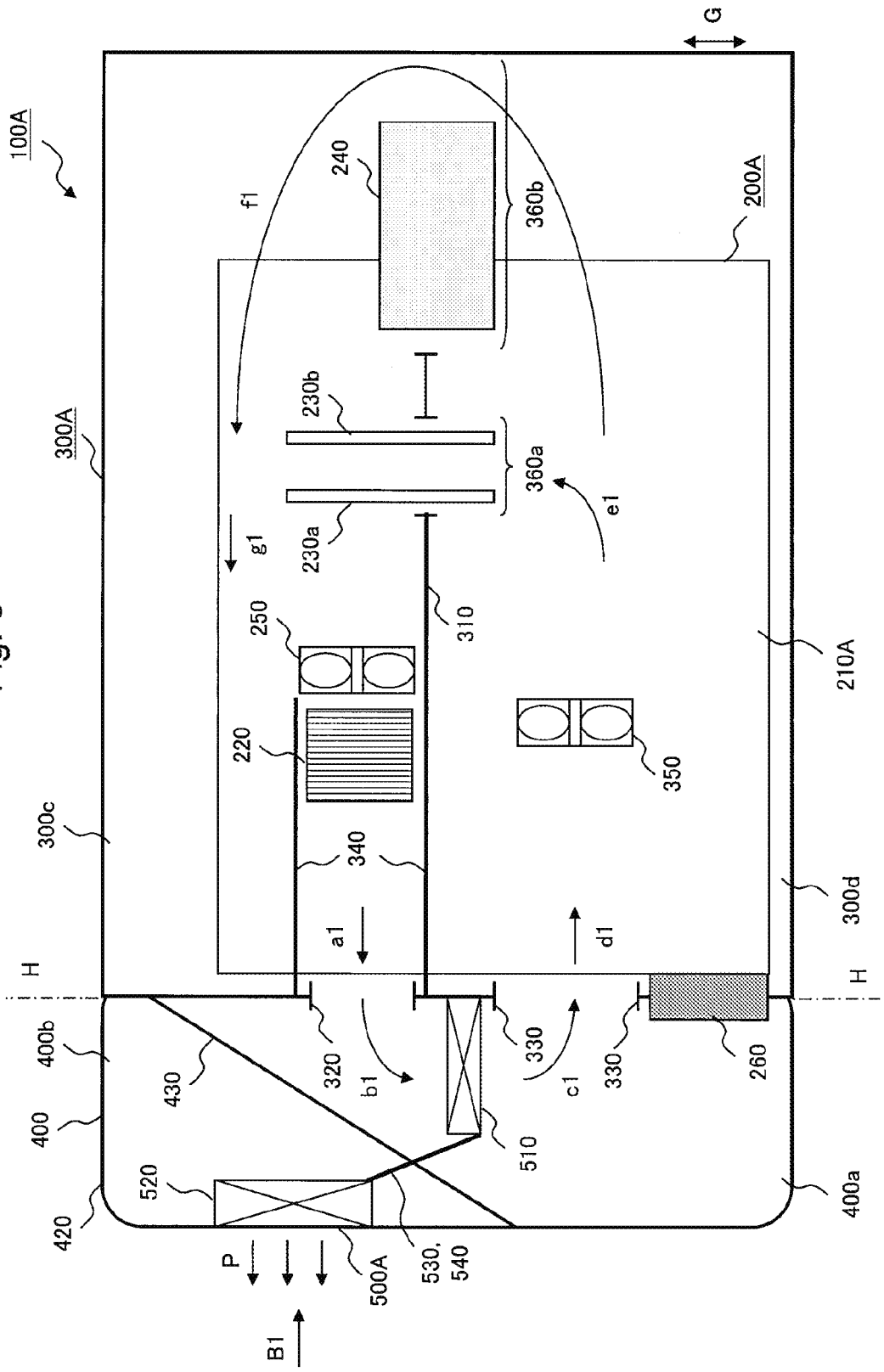

VIEW ON ARROW J1

VIEW ON ARROW K1

VIEW ON ARROW B1

VIEW ON ARROW C1

VIEW ON ARROW D1

ELECTRONIC DEVICE AND COOLING SYSTEM

CROSS-REFERENCE TO RELATED APPLICATIONS

This application is a national stage application of International Application No. PCT/JP2014/000840 entitled "Electronic Device and Cooling System," filed on Feb. 19, 2014, which claims priority to Japanese Patent Application No. 2013-035781, filed on Feb. 26, 2013, the disclosures of each which are hereby incorporated by reference in their entirety.

FIELD OF INVENTION

The present invention relates to an electronic device and a cooling system and, in particular, to an electronic device and the like that include a structure that dissipates heat from an electronic board on which a heat generating component is mounted.

BACKGROUND ART

Electronic devices such as communication equipment and computers are rapidly becoming more powerful and sophisticated, such as being able to perform a large amount of computation at a time at high speed. With the advances, more heat is being generated especially by CPUs (Central Processing Units) and MCMs (Multi-Chip Modules) among the components mounted in electronic devices (for example ICT (Information and Communication Technology) devices).

While heat generated by CPUs and MCMs is increasing, there is a growing demand for installing electronic devices such as communication equipment and computers in various environments as well as computer rooms dedicated to installation of computers.

Among known techniques relating to electronic devices that respond to the demand are techniques for efficiently cooling electronic devices by hermetically enclosing the electronic devices (for example PTL 1 to PTL 3).

In the technique described in PTL 1, a partition (partition wall) is provided in an enclosure and a fan unit (air blower) blows air to send out heat generated by a heat generating component (heat generating element) along the partition to a cooling module (evaporator). A coolant is circulated in the cooling module. Air flowing into the cooling module passes through the fan unit again. In this way, in the technique described in PTL 1, air in the enclosure is circulated along the partition so that air blown by the fan unit (air blower) guides heat from the heat generating component to the cooling module.

In the techniques described in PTL 2 and PTL 3, air cooled by a cooling module (a fan-assisted heatsink, fan assisted heat pipe) is circulated in an enclosure by air blowing by a fan unit. With this, heat from a heat generating component (such as a power device) provided in the enclosure is cooled down. A coolant is circulated in the heatsink.

CITATION LIST

Patent Literature

[PTL 1] Japanese Laid-open Patent Publication No. 2012-23141
[PTL 2] Japanese Patent Publication No. 3348552
[PTL 3] Japanese Laid-open Patent Publication No. 2004-158641

SUMMARY OF INVENTION

Technical Problem

In the techniques described in PTL 1 to PTL 3, air in the enclosure is circulated by blowing with a fan unit so that heat from a heat generating component flows into a heat dissipating unit or a cooling module.

However, there has been a problem that circulating air flow alone in the enclosure cannot sufficiently cool heat generated by a heat generating component. In addition, the techniques described in PTL 1 to PTL 3 require provision of dedicated equipment for circulating the coolant into the cooling module, which adds to structural complexity.

The present invention has been made in light of these circumstances. An object of the present invention is to provide an electronic device and a cooling system that solve the problem that a complicated structure, such as provision of dedicated equipment for circulating coolant into a cooling unit, has been needed to cool a heat generating component on an electronic board.

Solution to Problem

An electronic device according to the present invention includes an electronic board on which a heat generating component is mounted, an enclosure housing the electronic board, a heat transport unit coupled to the enclosure and transporting heat from the heat generating component to the outside, a heat receiving unit provided in the heat transport unit and receiving heat from the heat generating component, a heat dissipating unit provided in the heat transport unit in such a manner that a portion of the heat dissipating unit is exposed to outside air, the heat dissipating unit being coupled to the heat receiving unit and dissipating heat received by the heat receiving unit to the outside, and a guide duct unit formed by interconnecting the heat generating component and the heat receiving unit in a tubular form in order to send heat from the heat generating component to the heat receiving unit.

A cooling system according to the present invention includes an enclosure housing the electronic board on which a heat generating component is mounted, a heat transport unit coupled to the enclosure and transporting heat from the heat generating component to the outside, a heat receiving unit provided in the heat transport unit and receiving heat from the heat generating component, a heat dissipating unit which is provided in the heat transport unit in such a manner that a portion of the heat dissipating unit is exposed to outside air and which is coupled to the heat receiving unit and dissipates heat received by the heat receiving unit to the outside, and a guide duct unit formed by interconnecting the heat generating component and the heat receiving unit in a tubular form in order to send heat from the heat generating component to the heat receiving unit.

Advantageous Effects of Invention

The electronic device and the cooling system according to the present invention are capable of efficiently cooling a heat generating component on an electronic board by using a small and simple configuration.

BRIEF DESCRIPTION OF DRAWINGS

FIG. 8 is a side perspective view illustrating a configuration of an electronic device in a second exemplary embodiment of the present invention, viewed from a side.

DESCRIPTION OF EMBODIMENTS

First Exemplary Embodiment

A configuration of an electronic device 100 in a first exemplary embodiment of the present invention will be described with reference to drawings.

Figure 1:
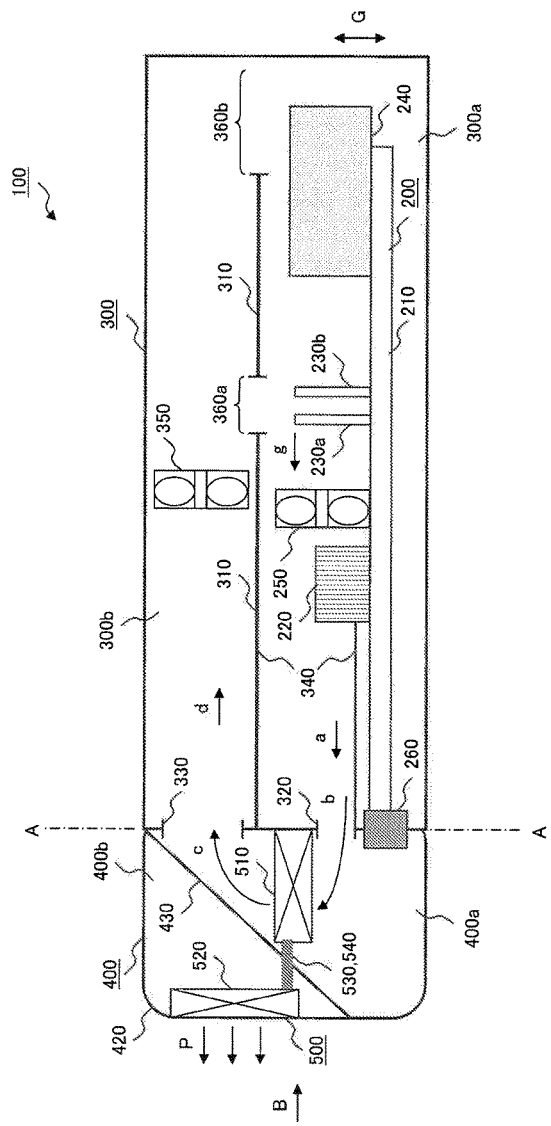
FIG. 1 is a side perspective view illustrating a configuration of an electronic device in a first exemplary embodiment of the present invention, viewed from a side.

FIG. 1 is a side perspective view illustrating a configuration of the electronic device 100 in the first exemplary embodiment of the present invention, viewed from a side. Note that the vertical direction G is illustrated in FIG. 1 for convenience of explanation.

As illustrated in FIG. 1, the electronic device 100 includes an electronic board 200, an enclosure 300 and a heat transport unit 400.

The electronic board 200, the enclosure 300 and the heat transport unit 400 will be described below in detail with reference to the drawing.

The enclosure 300 and the heat transport unit 400 can be separated along plane A-A in FIG. 1. In other words, the heat transport unit 400 is detachably attached to the enclosure 300 along plane A-A. Note that the plane of the electronic board 200 is positioned substantially perpendicular to the vertical direction G as illustrated in FIG. 1.

A configuration of the electronic board 200 will be described first. The electronic board 200 includes a substrate 210, a heat generating component 220, memories 230, a hard disk device (hereinafter abbreviated as HDD) 240, a heat-generating-component fan unit 250, and a connector unit 260. Note that the present invention can also be implemented without the memories 230, the hard disk device (hereinafter abbreviated as HDD) 240, the heat-generating-component fan unit 250, and the connector unit 260.

The substrate 210 is a printed circuit board formed into a plate, for example. The substrate 210 is made of a flame-retardant material such as glass epoxy, for example.

The heat generating component 220 is a component that generates heat during operation and is a CPU or an MCM, for example. The heat generating component 220 is attached to the substrate 210 with solder (not depicted), for example. In other words, at least the heat generating component 220 is mounted on the electronic board 200. Note that while the heat generating component 220 has been described herein as being soldered to the substrate 210, the heat generating component 220 may be attached to the substrate 210 using a socket (not depicted), for example.

The memories 230a, 230b are formed by electronic boards on which a plurality of electronic components (not depicted) are mounted. The memories 230a, 230b are attached to connectors (not depicted), for example, mounted on the substrate 210. With this, memories 230a, 230b are held on the substrate 210.

The HDD 240 includes a disk (not depicted) or a semiconductor (not depicted) for storing data inside the HDD 240. The HDD 240 is electrically connected to a wiring line (not depicted) formed on the substrate 210. The HDD 240 is housed in a holder (not depicted) attached on the substrate 210. With this, the HDD 240 is held on the substrate 210. Note that while only one HDD 240 is depicted in FIG. 1, a plurality of HDD 240 may be attached on the substrate 210.

As illustrated in FIG. 1, the heat-generating-component fan unit 250 is provided on the substrate 210. The heatgenerating-component fan unit 250 is disposed near the heat generating component 220 in such a manner that the heat-generating-component fan unit 250 faces the heat generating component 220. The heat-generating-component fan unit 250 cools the components 220, 230a, 230b and 240 (especially the heat generating component 220 among these components) in the enclosure 300. The heat-generating-component fan unit 250 accelerates circulation of air between an electronic-board housing chamber 300a, a heat-receiving-unit housing chamber 400a and an air guide chamber 300b, which will be described later.

As illustrated in FIG. 1, the connector unit 260 is a USB (Universal Serial Bus) or the like, for example, which can be connected to an external wiring plug. The connector unit 260 is covered with the heat transport unit 400.

The configuration of the electronic board 200 has been described so far.

A configuration of the enclosure 300 will be described next. As illustrated in FIG. 1, the enclosure 300 houses the electronic board 200. This can protect the electronic board 220 from dust and dirt. The enclosure 300 is made of a thermally conductive material such as aluminum, copper or an alloy of these, for example, more preferably a low-thermal-resistance material.

As illustrated in FIG. 1, the enclosure 300 is divided into two chambers by an enclosure partition 310. Specifically, the enclosure 300 includes an electronic-board housing chamber 300a and an air guide chamber 300b. The electronic-board housing chamber 300a is equivalent to a heat-generating-component housing chamber of the present invention.

As illustrated in FIG. 1, the enclosure partition 310 is provided between the electronic-board housing chamber 300a and the air guide chamber 300b and separates the electronic-board housing chamber 300a from the air guide chamber 300b.

As illustrated in FIG. 1, the electronic-board housing chamber 300a houses the electronic board 200. The air guide chamber 300b houses neither of the electronic board 200 nor a heat receiving unit 510, which will be described later. The air guide fan unit 350 is disposed in the air guide chamber 300b. However, the air guide fan unit 350 may be omitted. The air guide chamber 300b forms an air flow path between the heat-receiving-unit housing chamber 400a in the heat transport unit 400, which will be described later, and the electronic-board housing chamber 300a. More specifically, the air guide chamber 300b guides air flowing from the heat-receiving-unit housing chamber 400a into the electronic-board housing chamber 300a.

As illustrated in FIG. 1, the enclosure 300 includes the enclosure partition 310, a warm air outlet 320, a cool air inlet 330, a guide duct unit 340, an air guide fan unit 350, and communicating holes 360a, 360b.

The enclosure partition 310 is attached to an inner wall of the enclosure 300 by welding or the like. The enclosure partition 310 is made of a thermally conductive material such as aluminum, copper or an alloy of these, for example, more preferably a low-thermal-resistance material.

As illustrated in FIG. 1, the warm air outlet 320 and the cool air inlet 330 are formed along plane A-A which joins the heat transport unit 400. Note that the warm air outlet 320 is equivalent to a first opening of the present invention; the cool air inlet 330 is equivalent to a second opening of the present invention.

The warm air outlet 320 is formed between the electronic-board housing chamber 300a and the heat receiving unit 510 in the heat transport unit 400, which will be described later.

The warm air outlet 320 communicates between the electronic-board housing chamber 300a and the heat-receiving-unit housing chamber 400a.

As illustrated in FIG. 1, the heat generating component 220 is disposed in such a manner that the heat generating component 220 faces the warm air outlet 320. This allows air with heat from the heat generating component 220 flows through the warm air outlet 320 directly into the heat-receiving-unit housing chamber 400a. Accordingly, air with heat from the heat generating component 220 can be efficiently flowed into the heat-receiving-unit housing chamber 400a.

The heat generating component 220 is disposed between the heat-generating-component fan unit 250 and the warm air outlet 320. This allows heat generated by the heat generating component 220 to be directly cooled by the heat-generating-component fan unit 250. Furthermore, air blown by the heat-generating-component fan unit 250 absorbs heat from the heat-generating component 220, becomes warm air, and flows through the warm air outlet 320 into the heat-receiving-unit housing chamber 400a.

The cool air inlet 330 is formed between the air guide chamber 300b and the heat-receiving-unit housing chamber 400a in the heat transport unit 400, which will be described later. The cool air inlet 330 communicates between the heat-receiving-unit housing chamber 400a and the air guide chamber 300b.

In this way, the warm air outlet 320 and the cool air inlet 330 are separately formed in the enclosure 300. This can prevent mixing of warm air flowing from the electronic-board housing chamber 300a into the heat-receiving-unit housing chamber 400a and cool air flowing from the heat-receiving-unit housing chamber 400a into the air guide chamber 300b.

As illustrated in FIG. 1, the guide duct unit 340 is formed by interconnecting the heat generating component 220 and the heat receiving unit 510 in a tubular form in order to send heat generated by the heat generating component 220 to the heat receiving unit 510 in the heat-receiving-unit housing chamber 400a, which will be described later. The guide duct unit 340 in FIG. 1 includes a portion of the enclosure partition 310. However, the configuration is not limited to this and the guide duct unit 340 may be provided completely separately from the enclosure partition 310.

As illustrated in FIG. 1, the guide duct unit 340 connects to the heat-receiving-unit housing chamber 400a through the warm air outlet 320. Note that no other electronic components that act as resistance to air are provided between the heat generating component 220 and the warm air outlet 320 as illustrated in FIG. 1. In this way, air with heat from the heat generating component 220 flows through the guide duct unit 340 directly into the heat receiving unit 510 in the heat-receiving-unit housing chamber 400a without being affected by obstacles that can act as resistance to air. Accordingly, air with heat from the heat-generating component 220 can be efficiently flowed into the heat receiving unit 510. Consequently, the heat receiving unit 510 can efficiently receive heat from the heat generating component 220.

As illustrated in FIG. 1, the air guide fan unit 350 is attached on the enclosure partition 310 in the air guide chamber 300b. The air guide fan unit 350 draws air from the heat-receiving-unit housing chamber 400a of the heat transport unit 400, which will be described later, into the air guide chamber 300b and causes the drawn air to flow back into the electronic-board housing chamber 300a as illustrated in FIG. 1. Furthermore, in conjunction with the heat-generating-component fan unit 250, the air guide fan unit 350 accelerates circulation of air between the electronic-board housing chamber 300a, the heat-receiving-unit housing chamber 400a and the air guide chamber 300b.

As illustrated in FIG. 1, communicating holes 360a, 360b are formed in the enclosure partition 310. The communicating holes 360a, 360b communicate between the electronic-board housing chamber 300a and the air guide chamber 300b. Accordingly, air in the electronic-board housing chamber 300a and air in the air guide chamber 300b can flow in and out through the communicating holes 360a, 360b. Note that the communicating holes 360a, 360b are equivalent to a third opening of the present invention.

The configuration of the enclosure 300 has been described so far.

A configuration of the heat transport unit 400 will be described next.

As illustrated in FIG. 1, the heat transport unit 400 includes a cooling unit 500, a cooling unit enclosure 420, and a heat transport partition 430. The heat transport unit 400 is coupled to the enclosure 300 and transports and dissipates heat from the heat-generating component 220 to the outside (outside the enclosure 300 and outside the heat transport unit 400).

The cooling unit 500 is housed in the cooling unit enclosure 420. The cooling unit enclosure 420 hermetically houses the cooling unit 500.

The cooling unit enclosure 420 is made of a thermally conductive material such as aluminum, copper or an alloy of these, for example, more preferably a low-thermal-resistance material. This enables efficient cooling of heat of the heat generating component 220 flowing from the enclosure 300 through the warm air outlet 320.

The cooling unit enclosure 420 is detachably attached to the enclosure 300 along plane A-A as illustrated in FIG. 1. The cooling unit enclosure 420 is attached to the enclosure 300 in such a manner that the cooling unit enclosure 420 covers the connector unit 260.

Note that the heat transport partition 430 has the role of preventing dust and dirt outside the heat transport unit 400 from entering the heat receiving unit 410 and hence is also called dust protective partition.

The heat transport unit 400 includes a heat-receiving-unit housing chamber 400a and a heat-dissipating-unit housing chamber 400b as illustrated in FIG. 1. The heat-receiving-unit housing chamber 400a is provided in the heat transport unit 400 and houses the heat receiving unit 510. The heat-dissipating-unit housing chamber 400b is provided in the heat transport unit 400 and houses a heat dissipating unit 520.

The heat transport partition 430 is provided between the heat-receiving-unit housing chamber 400a and the heat-dissipating-unit housing chamber 400b to prevent air from flowing back and forth between the heat-receiving-unit housing chamber 400a and the heat-dissipating-unit housing chamber 400b. The heat transport partition 430 is made of a thermally conductive material such as aluminum, copper or an alloy of these, for example, more preferably a low-thermal-resistance material. This enables efficient cooling of heat of the heat generating component 220 flowing from the enclosure 300 through the warm air outlet 320.

Figure 2A:
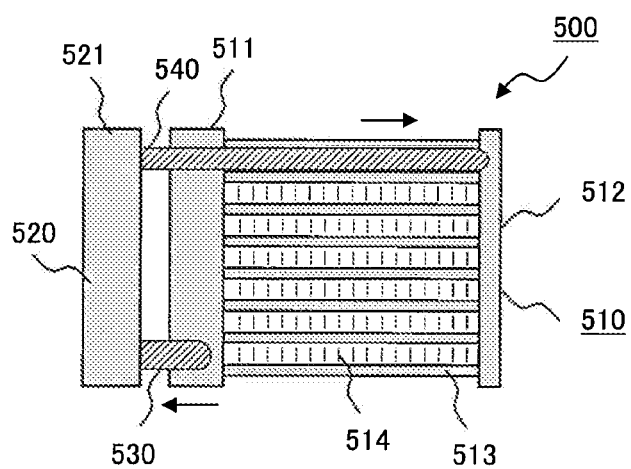
FIG. 2A is a diagram illustrating a configuration of a cooling unit in a heat transport unit and is a top view of the cooling unit.
Figure 2B:
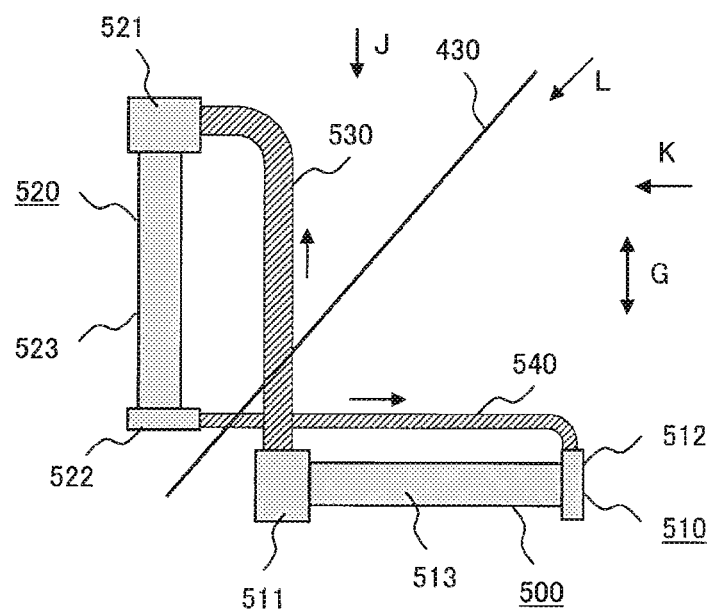
FIG. 2B is a diagram illustrating the configuration of the cooling unit in the heat transport unit and is a front view of the cooling unit.
Figure 2C:
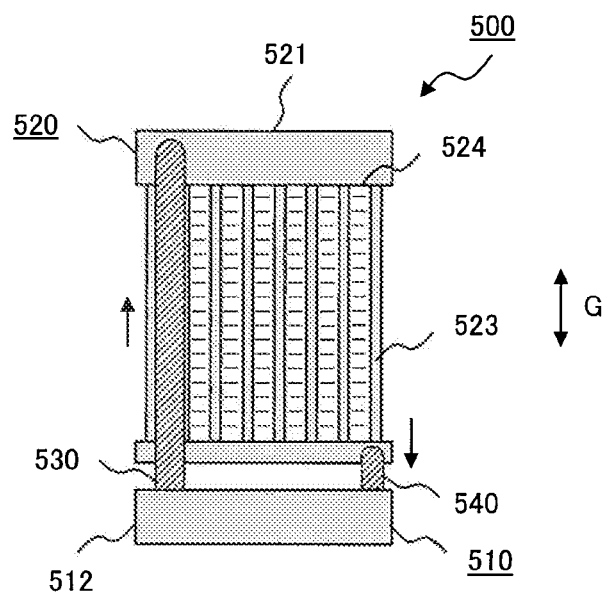
FIG. 2C is a diagram illustrating the configuration of the cooling unit in the heat transport unit and is a side view of the cooling unit.

A configuration of the cooling unit 500 will be described in detail next. FIG. 2A is a diagram illustrating a configuration of the cooling unit 500 in the heat transport unit 400 and is a top view of the cooling unit 500. FIG. 2B is a diagram illustrating the configuration of the cooling unit 500 in the heat transport unit 400 and is a front view of the cooling unit 500. FIG. 2C is a diagram illustrating the configuration of the cooling unit 500 in the heat transport unit 400 and is a side view of the cooling unit 500. The arrangement of the heat receiving unit 510 and the heat dissipating unit 520 in FIG. 2B corresponds to the arrangement in FIG. 1. FIG. 2A is a view on arrow J in FIG. 2B. FIG. 2C is a view on arrow K in FIG. 2B. Note that FIGS. 2B and 2C illustrate the vertical direction G. FIG. 2B also depicts the heat transport partition 430 for convenience of explanation.

As illustrated in FIG. 1 and FIGS. 2A to 2C, the cooling unit 500 includes the heat receiving unit 510, the heat dissipating unit 520, a vapor pipe 530, and a liquid pipe 540. The heat receiving unit 510 in the form of a plate and the heat dissipating unit 520 in the form of a plate are arranged so that they are substantially perpendicular to each other. The heat receiving unit 510 and the heat dissipating unit 520 are coupled with each other by the vapor pipe 530 and the liquid pipe 540. The liquid pipe 540 and the vapor pipe 530 are depicted as overlapping one another in FIG. 1 for convenience of illustration.

The cooling unit 500 includes coolant (Condensation preparations, hereinafter referred to as COO) which circulates between the heat receiving unit 510 and the heat dissipating unit 520. Specifically, a hollow space is provided in each of the heat receiving unit 510 and the heat dissipating unit 520. The coolant COO is hermetically confined in a closed space formed by the heat receiving unit 510, the heat dissipating unit 520, the vapor pipe 530 and the liquid pipe 540. The coolant COO circulates between the heat receiving unit 510 and the heat dissipating unit 520 through the vapor pipe 530 and the liquid pipe 540 while being hermetically confined. The coolant is made of a polymeric material, for example, and has the property of vaporizing at high temperature and liquefying at low temperature.

As illustrated in FIG. 1 and FIGS. 2A to 2C, the heat receiving unit 510 is housed in the heat-receiving-unit housing chamber 400a of the heat transport unit 400. The heat receiving unit 510 is hermetically provided in the heat-receiving-unit housing chamber 400a. The heat receiving unit 510 is coupled to the heat dissipating unit 520 by the vapor pipe 530 and the liquid pipe 540. The heat receiving unit 510 receives heat of the heat generating component 220 sent by the heat-generating-component fan unit 250. The heat receiving unit 510 then uses the coolant COO to transmit the received heat of the heat generating component 220 to the heat dissipating unit 520 through the vapor pipe 530. More specifically, blown air heated mainly by heat of the heat generating component 220 flows into the heat-receiving-unit housing chamber 400a through the guide duct unit 340 and the warm air outlet 320. The heat receiving unit 510 receives heat of the heat generating component 220 flowing into the heat-receiving-unit housing chamber 400a through the blown air. The heat receiving unit 510 then uses the coolant COO to transmit the received heat of the heat generating component 220 to the heat dissipating unit 520 through the vapor pipe 530. In this way, heat from the heat generating component 220 is transmitted to the heat dissipating unit 520.

As described previously, air with heat of the heat generating component 220 is flowed into the heat-receiving-unit housing chamber 400a through the tubular guide duct unit 340 by wind force produced by the heat-generating-component fan unit 250. Accordingly, air with heat from the heat generating component 220 flows through the guide duct unit 340 directly into the heat receiving unit 510 in the heat-receiving-unit housing chamber 410a without being affected by obstacles that can act as resistance to air. Thus air with heat from the heat generating component 220 can be efficiently flowed into the heat receiving unit 510. Consequently, the heat receiving unit 510 can efficiently receive heat from the heat generating component 220.

The heat receiving unit 510 is provided in such a manner that the heat receiving unit 510 faces the warm air outlet 320 as illustrated in FIG. 1. This enables the heat receiving unit 510 to efficiently receive heat of the heat generating component 220 flowing from the warm air outlet 320.

As illustrated in FIG. 1 and FIGS. 2A to 2C, the heat dissipating unit 520 is coupled to the heat receiving unit 510 by the vapor pipe 530 and the liquid pipe 540. As illustrated in FIG. 1, the heat dissipating unit 520 is disposed in such a manner that a portion of the heat dissipating unit 520 is exposed outside the cooling unit enclosure 420 of the heat transport unit 400. The heat dissipating unit 520 receives heat of the heat generating component 220 received by the heat receiving unit 510 and dissipates the heat. Specifically, the heat dissipating unit 520 receives heat generated by the heat generating component 220 from the heat receiving unit 510 through the coolant COO. The heat dissipating unit 520 then dissipates the received heat of the heat generating component 220 from the heat transport unit 400 to the outside.

The heat receiving unit 510 is hermetically housed in the heat-receiving-unit housing chamber 400a of the cooling unit enclosure 420. On the other hand, the heat dissipating unit 520 is provided in such a manner that a portion of the heat dissipating unit 520 is exposed outside the cooling unit enclosure 420. Accordingly, heat released by the heat dissipating unit 520 does not fill the cooling unit enclosure 420 and heat generated by the heat generating component 220 can be efficiently dissipated to the ambient air as compared with an arrangement where the entire heat dissipating unit 520 is hermetically provided in the cooling unit enclosure 420.

As illustrated in FIG. 1 and FIGS. 2A to 2C, the vapor pipe 530 couples the heat receiving unit 510 and the heat dissipating unit 520 together. Similarly, the liquid pipe 540 couples the heat receiving unit 510 and the heat dissipating unit 520 together. The vapor pipe 530 and the liquid pipe 540 are used for circulating coolant COO between the heat receiving unit 510 and the heat dissipating unit 520. Specifically, the vapor pipe 530 transports coolant COO vaporized in the heat receiving unit 510 from the heat receiving unit 510 to the heat dissipating unit 520. On the other hand, the liquid pipe 540 transports coolant COO condensed and liquefied in the heat dissipating unit 520 from the heat dissipating unit 520 to the heat receiving unit 510.

The connection between the vapor pipe 530 and the heat dissipating unit 520 is positioned higher than the connection between the liquid pipe 540 and the heat receiving unit 510 and higher than the connection between the liquid pipe 540 and the heat dissipating unit 510 in the vertical direction G.

This enables the coolant COO in the cooling unit 500 to be smoothly circulated between the heat receiving unit 510 and the heat dissipating unit 520. Specifically, coolant COO vaporized in the heat receiving unit 510 by heat generated by the heat generating component 220 smoothly flows upward in the vapor pipe 530 in the vertical direction G. Then the coolant COO condensed and liquefied in the heat dissipating unit 520 flows downward in the heat dissipating unit 520 in the vertical direction G. The coolant COO that has flowed downward in the heat dissipating unit 520 in the vertical direction G flows through the liquid pipe 540 into the heat receiving unit 510. Then the process described above is repeated.

An internal configuration of the heat receiving unit 150 and the heat dissipating unit 520 will be described below in further detail. Note that the heat receiving unit 510 and the heat dissipating unit 520 have basically the same configuration.

As illustrated in FIGS. 2A, 2B and 2C, each of the heat receiving unit 510 and the heat dissipating unit 520 is formed into a flat plate, for example. The heat receiving unit 510 includes a vapor-pipe connecting tank unit 511, a liquid-pipe connecting tank unit 512, a plurality of connecting pipe units 513, and a plurality of heat-receiving-unit fin units 514.

The vapor-pipe connecting tank unit 511 is connected to the heat dissipating unit 520 through the vapor pipe 530. The liquid-pipe connecting tank unit 512 is connected to the heat dissipating unit 520 through the liquid pipe 540. The connecting pipe units 513 interconnect the vapor-pipe connecting tank unit 511 and the liquid-pipe connecting tank unit 512. A plurality of connecting pipe units 513 are provided. The plurality of heat-receiving-unit fin units 514 are provided between the plurality of connecting pipe units 513. The heat-receiving-unit fin units 514 remove heat from heated blown air and transfer the received heat to coolant COO in the connecting pipe units 513. The coolant COO, which has received the heat, changes phase from the liquid phase to the vapor phase and flows in the connecting pipe units 513 upward in the vertical direction G.

As illustrated in FIGS. 2A, 2B and 2C, the heat dissipating unit 520 includes a vapor-pipe connecting tank unit 521, a liquid-pipe connecting tank unit 522, a plurality of connecting pipe units 523 and a plurality of heat-dissipating-unit fin units 524.

The vapor-pipe connecting tank unit 521 is connected to the heat receiving unit 510 through the vapor pipe 530. The liquid-pipe connecting tank unit 522 is connected to the heat receiving unit 510 through the liquid pipe 540. The connecting pipe units 523 interconnect the vapor-pipe connecting tank unit 521 and the liquid-pipe connecting tank unit 522. A plurality of connecting pipe units 523 are provided. The plurality of heat-receiving-unit fin units 524 are provided between the plurality of connecting pipe units 523. The heat-dissipating-unit fin units 524 dissipate heat from coolant COO in the vapor phase that has flowed from the vapor-pipe connecting tank unit 521. The coolant COO from which heat has been dissipated changes phase from the vapor phase to the liquid phase and flows in the connecting pipe units 523 downward in the vertical direction G toward the liquid-pipe connecting tank unit 522.

Note that each of the heat-receiving-unit fin units 514 and the heat-dissipating-unit fin units 524 are made up of a plurality of fins and is configured to allow air to pass between the plurality of fins. In other words, air can pass through in the region of the heat-receiving-unit fin units 514 from one main surface of the heat receiving unit 510 to the other main surface. Similarly, air can pass through in the region of the heat-dissipating-unit fin units 524 from one main surface of the heat dissipating unit 520 to the other main surface.

As described above, the connection between the vapor pipe 530 and the heat dissipating unit 520 is positioned higher than the connection between the liquid pipe 540 and the heat receiving unit 510 and higher than the connection between the liquid pipe 540 and the heat dissipating unit 510 in the vertical direction G.

In other words, the connection between the vapor pipe 530 and the vapor-pipe connecting tank unit 521 of the heat dissipating unit 520 is positioned higher than the connection between the liquid pipe 540 and the liquid-pipe connecting tank unit 512 of the heat receiving unit 510 in the vertical direction G as illustrated in FIGS. 2A, 2B and 2C. Additionally, the connection between the vapor pipe 530 and the vapor-pipe connecting tank unit 521 of the heat dissipating unit 520 is positioned higher than the connection between the liquid pipe 540 and the liquid-pipe connecting tank unit 522 of the heat dissipating unit 520 in the vertical direction G.

A method for filling the closed space in the cooling unit 500 with coolant COO is as follows. First, the coolant COO is injected into the closed space formed by the hollow spaces inside the heat receiving unit 510 and the heat dissipating unit 520, and the vapor pipe 530 and the liquid pipe 540. Then a vacuum pump (not depicted) or the like is used to remove air from the closed space to hermetically confine the coolant COO in the closed space. This equalizes the pressure in the space with the saturation vapor pressure of the coolant and the boiling point of the coolant COO hermetically confined in the closed space becomes close to room temperature. This completes the description of the method for filling the closed space in the cooling unit 400 with the coolant COO.

When the heat receiving unit 510 receives heat from the heat generating component 220 while the cooling unit 500 filled with the coolant COO is in the environment at room temperature as described above, the coolant COO boils and vapor is generated. As a result, the cooling structure including at least the heat receiving unit 510, the heat dissipating unit 520, the vapor pipe 530 and the liquid pipe 540 functions as a cooling module and starts to receive heat from the heat generating component 220.

Specifically, the heat receiving unit 510 receives heat of the heat generating component 220 through warm air that flows from the electronic-board housing chamber 300a through the warm air outlet 320 as illustrated in FIG. 1. When the heat receiving unit 510 receives heat generated by the heat generating component 220, the coolant COO in the heat receiving unit 510 boils and enters the vapor phase. During this period of time, the heat-receiving-unit fin unit 514 receives heat from the heat generating component 220 which is contained in the warm air.

Then the coolant COO in the vapor phase in the heat receiving unit 510 flows through the vapor pipe 530 into the vapor-pipe connecting tank unit 521 of the heat dissipating unit 520. In the heat dissipating unit 520, the coolant COO in the vapor phase is cooled to dissipate heat contained in the coolant COO (heat from the heat generating component 220). The coolant COO in the vapor phase is condensed and cooled in the heat dissipating unit 520 and changes to the liquid phase. At this point in time, the coolant COO in the liquid phase in the heat dissipating unit 520 flows down from the vapor-pipe connecting tank unit 521 side to the liquid-pipe connecting tank unit 522 side. During this period of time, the heat-dissipating-unit fin units 524 radiate heat of the coolant COO flowing down in the connecting pipe unit 523 to dissipate heat contained in the coolant COO (heat from the heat generating component 220).

Then the coolant COO cooled in the heat dissipating unit 520 enters the liquid phase and is accumulated in the liquid-pipe connecting tank unit 522 of the heat dissipating unit 520, then the coolant COO in the liquid phase flows back into the heat receiving unit 510 through the liquid pipe 440.

In this way, the coolant COO receives heat through the heat receiving unit 510 from warm air (with heat from the heat generating component 220) passing through the heat receiving unit 510 and circulates through the heat receiving unit 510, the vapor pipe 530, the heat dissipating unit 520 and the liquid pipe 540 in this order. Consequently, heat from the heat generating component 220 received by the heat receiving unit 510 is dissipated.

As described above, the cooling unit 500 circulates the coolant COO between the heat receiving unit 510 and the heat dissipating unit 520 while changing the phase of the coolant COO (between the liquid phase and the vapor phase), thereby cooling warm air from which heat is received by the heat receiving unit 510.

As noted above, the connection between the vapor pipe 530 and the heat dissipating unit 520 is positioned higher than the connection between the liquid pipe 540 and the heat receiving unit 510 and higher than the connection between the liquid pipe 540 and the heat dissipating unit 510 in the vertical direction G. Accordingly, the coolant COO in the cooling unit 500 can be smoothly circulated between the heat receiving unit 510 and the heat dissipating unit 520. Specifically, the coolant COO which has been vaporized in the heat receiving unit 510 by heat generated by the heat generating component 220 smoothly flows in the vapor pipe 530 upward in the vertical direction G. Then the coolant COO condensed and liquefied in the heat dissipating unit 520 flows downward in the vertical direction G in the heat dissipating unit 520. The coolant COO which has flowed in the heat dissipating unit 520 downward in the vertical direction G flows through the liquid pipe 540 into the heat receiving unit 510. Then the process described above is repeated.

The configuration and operation of the cooling unit 500 have been described so far.

An operation of the electronic device 100 will be described next with reference to drawings.

First, when the electronic device 100 is powered on, the heat generating component 220 generates heat. As illustrated in FIG. 1, heat generated by the heat generating component 220 is carried by air in the enclosure 300 blown by the heat-generating-component fan unit 250 and travels through the guide duct unit 340 provided in the electronic-board housing chamber 300a toward the heat-receiving-unit housing chamber 400a (as indicated by arrow a in FIG. 1). In this way, air containing heat generated by the heat generating component 220 flows through the guide duct unit 340 directly into the heat receiving unit 510 in the heat-receiving-unit housing chamber 400a without being affected by obstacles that can act as resistance to air. Accordingly, air with heat from the heat-generating component 220 can be efficiently flowed into the heat receiving unit 510. Consequently, the heat receiving unit 510 can efficiently receive heat from the heat generating component 220. Then air (warm air) containing heat generated by the heat generating component 220 flows from the electronic-board housing chamber 300a through the warm air outlet 320 into the heat-receiving-unit housing chamber 400a (as indicated by arrow b in FIG. 1).

Then the heat receiving unit 510 of the cooling unit 500 receives heat from the heat generating component 220 which is contained in the warm air in the heat-receiving-unit housing chamber 400a. The heat dissipating unit 520 of the cooling unit 500 dissipates the heat received by the heat receiving unit 510 outside the heat transport unit 400 (indicated by arrow P in FIG. 1). Since the heat dissipating unit 520 is provided in such a manner that a portion of the heat dissipating unit 520 is exposed outside the heat transport unit 400, dissipated heat does not fill the heat-receiving-unit housing chamber 400a. Accordingly, the heat dissipating unit 520 can efficiently dissipate heat generated by the heat generating component 220.

The cooling unit 500 circulates the coolant COO while changing the phase of the coolant COO (between the liquid phase and the vapor phase), thereby dissipating heat generated by the heat generating component 220. Further details are as described above with reference to FIGS. 2A, 2B and 2C.

Then air in the heat-receiving-unit housing chamber 400a flows from the heat-receiving-unit housing chamber 400a through the cool air outlet 330 into the air guide chamber 300b (as indicated by arrow c). While air flowing through the warm air outlet 330 into the heat-receiving-unit housing chamber 400a in the direction indicated by arrow b contains heat generated by the heat generating component 220, the heat generated by the heat generating component 220 is dissipated by the cooling unit 500. Thus air (warm air) flowing through the warm air outlet 330 into the heat-receiving-unit housing chamber 400a in the direction indicated by arrow b is cooled by the cooling unit 500. Accordingly, the temperature of the air (cool air) flowing through the cool air outlet 330 into the air guide chamber 300b in the direction indicated by arrow c is lower than the temperature of the air (warm air) passing through the warm air outlet 320 in the direction indicated by arrow b. In this way, forming the warm air outlet 320 and the cool air inlet 330 separately can prevent mixing of warm air flowing from the electronic-board housing chamber 300a into the heat-receiving-unit housing chamber 400a and cool air flowing from the heat-receiving-unit housing chamber 400a into the air guide chamber 300b.

Then, air flowing from the heat-receiving-unit housing chamber 400a into the air guide chamber 300b is moved in the air guide chamber 300b in the direction indicated by arrow d by the air guide fan unit 350 and flows through the communicating units 360a, 360b back into the electronic-board housing chamber 300a (as indicated by arrows e and f). While two communicating units 360a, 360b are provided in the enclosure partition 310, one communicating unit 360b may be provided in the enclosure partition 310. Alternatively, three or more communicating units may be provided in the enclosure partition 310.

Air that has passed through the communicating unit 360a cools the memories 230a, 230b. Air that has passed through the communicating unit 360b cools the HDD 240 and merges with the air that has passed through the communicating unit 360a. The air that has passed through the communicating units 360a, 360b is blown by the heat-generating-component fan unit 250 to flow back to the heat generating component 220 (as indicated by arrow g).

In this way, air containing heat generated by the heat generating component 220 is circulated by the heat-generating-component fan unit 250 and the air guide fan unit 350 through the electronic-board housing chamber 300a, the heat-receiving-unit housing chamber 400a and the air guide chamber 300b in this order. In other words, the air containing heat generated by the heat generating component 220 flows through the electronic-board housing chamber 300a, the heat-receiving-unit housing chamber 400a and the air guide chamber 300b back into the electronic-board housing chamber 300a. This can exhaust heat generated by the heat generating component 220 from the sealed enclosure 300 and the heat transport unit 400 to the outside. Thus the electronic device 100 enables efficient cooling.

The operation of the electronic device 100 has been described so far.

Figure 3A:
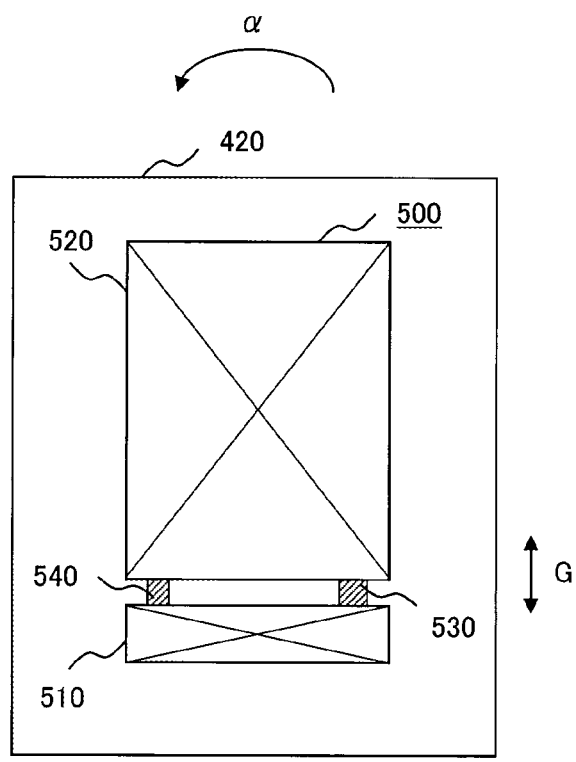
FIG. 3A is a view on arrow B in FIG. 1 and is a schematic side view of the cooling unit before the orientation of the electronic device in the first exemplary embodiment of the present invention is changed.
Figure 3B:
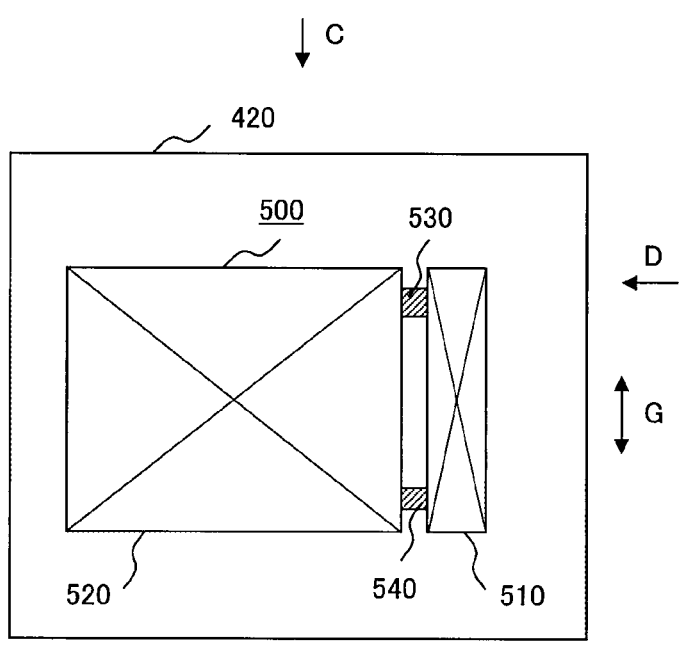
FIG. 3B is a schematic side view of the cooling unit after the orientation of the electronic device in the first exemplary embodiment of the present invention is changed.

A configuration and operation of a cooling unit when the orientation of the electronic device 100 has been changed will be described next. FIGS. 3A and 3B illustrate arrangements of the cooling unit 500 of the electronic device 100 in different orientations. FIG. 3B is a schematic side view of the cooling unit 500 after the orientation of the electronic device 100 has been changed. Note that a cooling unit enclosure 420 of a heat transport unit 400 is also depicted in FIGS. 3A and 3B for convenience of explanation. The vertical direction G is indicated in FIGS. 3A and 3B. In FIG. 3, the same reference numerals as the reference numerals in FIGS. 1 and 2 are given to the components that are the same as the components illustrated in FIGS. 1 and 2.

It is assumed that the electronic device 100 has been rotated by 90 degrees in the direction indicated by a as illustrated in FIG. 3A. As illustrated in FIGS. 1 and 3A, a main surface of a heat dissipating unit 520 is positioned substantially parallel to the vertical direction G before the orientation of the electronic device 100 has been changed. On the other hand, after the orientation of the electronic device 100 has been changed as illustrated in FIG. 3B, main surfaces of both of a heat receiving unit 510 and the heat dissipating unit 520 are positioned substantially parallel to the vertical direction G.

Figure 4A:
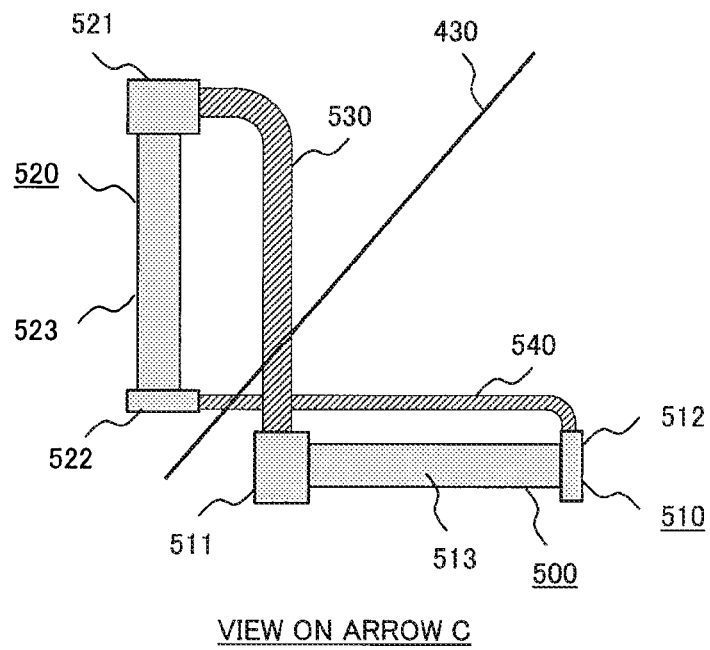
FIG. 4A is a diagram illustrating the arrangement of the cooling unit when the orientation of the electronic device in the first exemplary embodiment of the present invention has been changed and is a top view of the cooling unit.
Figure 4B:
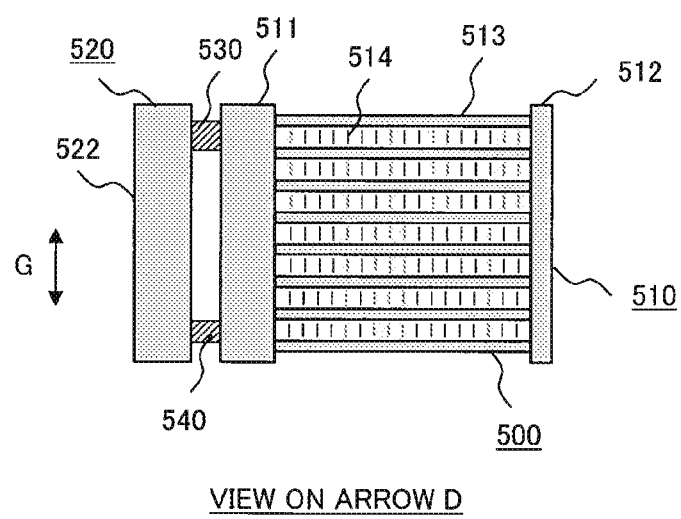
FIG. 4B is a diagram illustrating the arrangement of the cooling unit when the orientation of the electronic device in the first exemplary embodiment of the present invention has been changed and is a front view of the cooling unit.
Figure 4C:
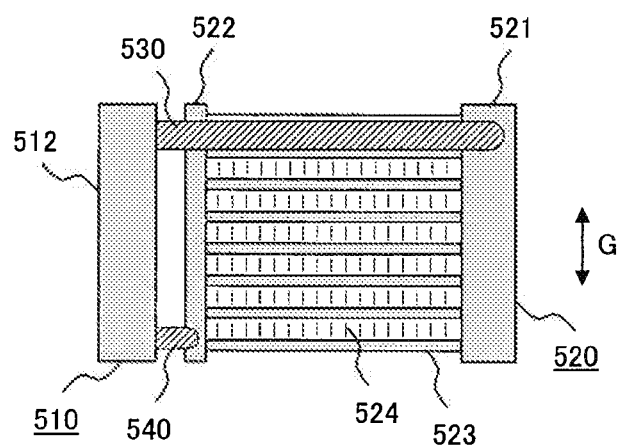
FIG. 4C is a diagram illustrating the arrangement of the cooling unit when the orientation of the electronic device in the first exemplary embodiment of the present invention has been changed and is a side view of the cooling unit.

FIGS. 4A to 4C are diagrams illustrating an arrangement of the cooling unit 500 when the orientation of the electronic device 100 has been changed. FIG. 4A is a top view of the cooling unit 500. FIG. 4A is a view on arrow C in FIG. 3B. FIG. 4B is a front view of the cooling unit 500. FIG. 4B is a view on arrow D in FIG. 3B. FIG. 4C is a side view of the cooling unit 500. The vertical direction G is indicated in FIGS. 4B and 4C. A heat transport partition 430 is also depicted in FIG. 4A for convenience of explanation. In FIG. 4, the same reference numerals as the reference numerals in FIGS. 1 to 3 are given to the components that are the same as the components illustrated in FIGS. 1 to 3.

FIGS. 2A, 2B and 2C illustrate an arrangement of the cooling unit 500 before the orientation of the electronic device 100 has been changed and FIGS. 4A, 4B and 4C illustrate an arrangement of the cooling unit 500 after the orientation of the electronic device 100 has been changed.

FIGS. 4A to 4C are compared with FIGS. 2A to 2C. As illustrated in FIGS. 2B and 2C, a main surface of the plate-like heat dissipating unit 520 is positioned substantially parallel to the vertical direction G before the orientation of the electronic device 100 has been changed. A main surface of the plate-like heat receiving unit 510 is positioned substantially perpendicular to the vertical direction G.

On the other hand, after the orientation of the electronic device 100 has been changed as illustrated in FIGS. 4B and 4C, main surfaces of both of the plate-like heat dissipating unit 520 and the plate-like heat receiving unit 510 are positioned substantially parallel to the vertical direction G.

Even though the orientation of the electronic device 100 has been changed, the connection between a vapor pipe 530 and the heat dissipating unit 520 is positioned higher than the connection between a liquid pipe 540 and the heat receiving unit 510 and higher than the connection between the liquid pipe 540 and the heat dissipating unit 510 in the vertical direction G, as before the change of the orientation of the electronic device 100.

In other words, as illustrated in FIGS. 4A, 4B and 4C, the connection between the vapor pipe 530 and the vapor-pipe connecting tank unit 521 of the heat dissipating unit 520 is positioned higher than the connection between the liquid pipe 540 and the liquid-pipe connecting tank unit 512 of the heat receiving unit 510 in the vertical direction G. Additionally, the connection between the vapor pipe 530 and the vapor-pipe connecting tank unit 521 of the heat dissipating unit 520 is positioned higher than the connection between the liquid pipe 540 and the liquid-pipe connecting tank unit 522 of the heat dissipating unit 520 in the vertical direction G.

Accordingly, even when the orientation of the electronic device 100 has been changed, coolant COO in the cooling unit 500 can be smoothly circulated between the heat receiving unit 510 and the heat dissipating unit 520 in the same way as before the change of the orientation of the electronic device 100. Specifically, the coolant COO which has been vaporized in the heat receiving unit 510 by heat generated by the heat generating component 220 passes through the vapor-pipe connecting tank unit 511 and smoothly flows in the heat receiving unit 520 upward in the vertical direction G. The vaporized coolant COO flowing in the vapor-pipe connecting tank unit 511 upward also flows into connecting pipe units 513 one after another. During this period of time, heat-receiving-unit fin units 514 receive heat from the heat generating component 220 which is contained in warm air.

The vaporized coolant COO which has gathered at the top of the heat receiving unit 510 flows through the vapor pipe 530 smoothly into the vapor-pipe connecting tank unit 521 of the heat dissipating unit 520. Then the coolant COO which has condensed and liquefied in the heat dissipating unit 520 flows along the liquid-pipe connecting tank unit 522 downward in the vertical direction G of the heat dissipating unit 520. The vaporized coolant COO flowing in the liquid-pipe connecting tank unit 522 downward also flows into connecting pipe units 523 one after another. During this period of time, heat-dissipating-unit fin units 524 radiate heat from the coolant COO flowing in the connecting pipe units 523 downward to dissipate heat contained in the coolant COO (heat from the heat generating component 220).

The coolant COO which has flowed in the heat dissipating unit 520 downward in the vertical direction G then flows through the liquid pipe 540 into the heat receiving unit 510. Then the process described above is repeated.

The configuration and operation of the cooling unit when the orientation of the electronic device 100 has been changed have been described so far.

A configuration of a first variation 400A of the heat transport unit 400 will be described next.

Figure 5:
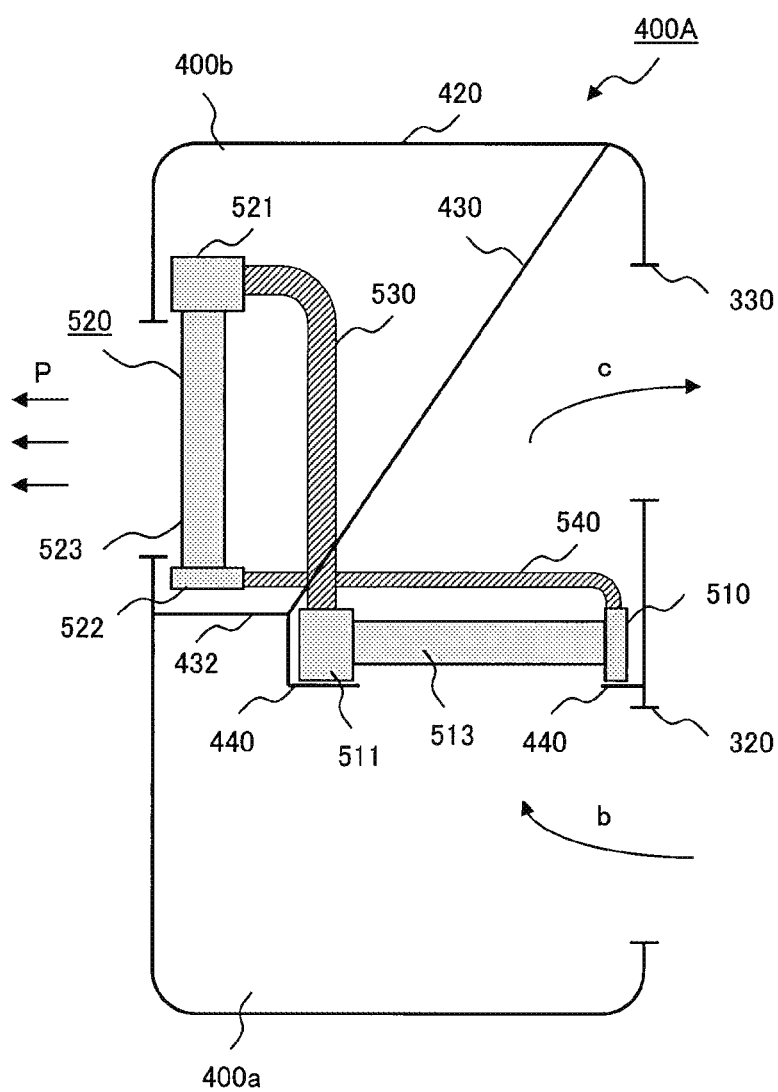
FIG. 5 is a diagram illustrating a configuration of a first variation of the heat transport unit.

FIG. 5 is a diagram illustrating a configuration of the first variation 400A of the heat transport unit 400. The arrangement of the heat transport unit 400A illustrated in FIG. 5 corresponds to the arrangement of the heat transport unit 400 illustrated in FIG. 1. The configuration of a cooling unit 500 included in the heat transport unit 400A is the same as the configuration described with reference to FIGS. 2A to 2C. In FIG. 5, the same reference numerals as the reference numerals in FIGS. 1 to 4 are given to the components that are the same as the components illustrated in FIGS. 1 to 4.

As illustrated in FIG. 5, the heat transport unit 400A includes the cooling unit 500, a cooling unit enclosure 430, a heat transport partition 430, and a heat receiving unit holder 440. The heat receiving unit holder 440 is equivalent to a holder of the present invention.

As illustrated in FIG. 5, the heat receiving unit holder 440 is provided along a periphery of the heat receiving unit 510. The heat receiving unit holder 440 holds the periphery of the heat receiving unit 510. The heat receiving unit holder 440 is provided between the periphery of the heat receiving unit 510 and the heat transport partition 430 and between the periphery of the heat receiving unit 510 and an inner wall of the heat transport unit 400A so as to prevent passage of air. Specifically, the heat receiving unit holder 440 covers the lower side of the periphery of the heat receiving unit 510 and is connected to the heat transport partition 430 as illustrated in FIG. 5. Additionally, the heat receiving unit holder 440 covers the lower side of the periphery of the heat receiving unit 510 and is connected to an inner wall of the cooling unit enclosure 420 as illustrated in FIG. 5.

In this way, the heat receiving unit holder 440 is provided between the periphery of the heat receiving unit 510 and the heat transport partition 430 and between the periphery of the heat receiving unit 510 and the inner wall of the heat transport unit 400A to prevent passage of air. This can prevent air that contains heat generated by the heat generating component 220 from flowing into the heat-dissipating-unit housing chamber 400b without passing through the heat receiving unit 510.

Note that the operation of the heat transport unit 400A is the same as the operation of the heat transport unit 400 described above and therefore detailed description of which is omitted.

A configuration of a second variation 400B of the heat transport unit 400 will be described next.

Figure 6:
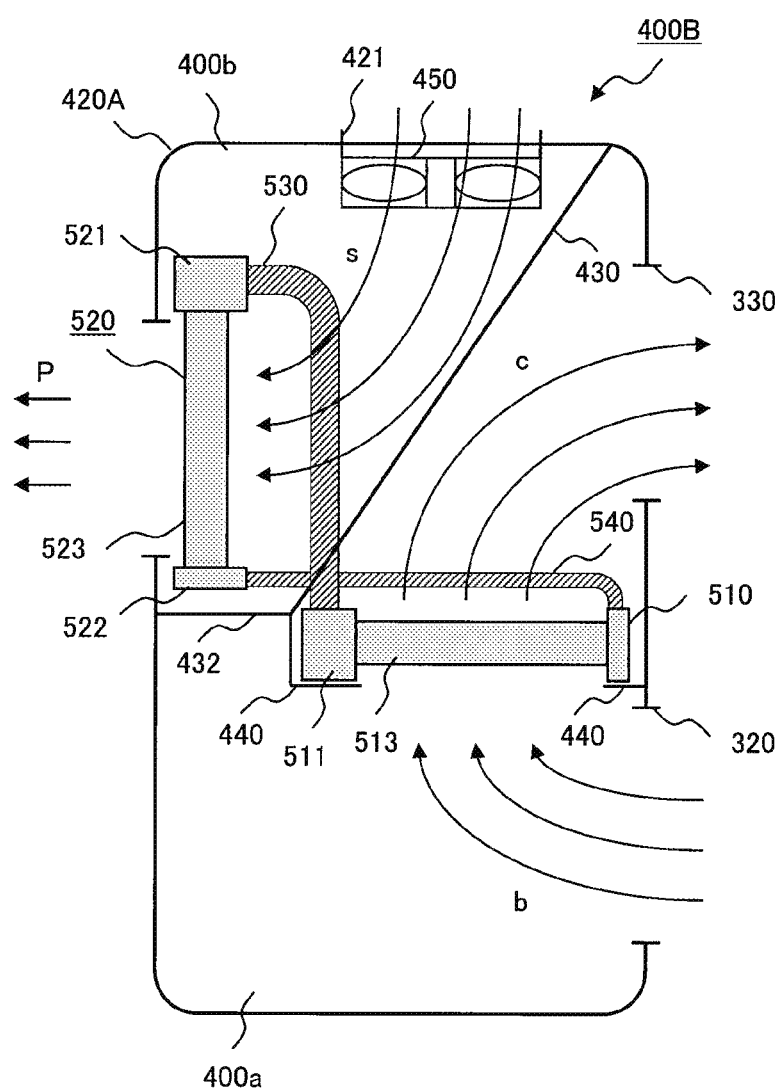
FIG. 6 is a diagram illustrating a configuration of a second variation of the heat transport unit.

FIG. 6 is a diagram illustrating a configuration of the second variation 400B of the heat transport unit 400. The arrangement of the heat transport unit 400B illustrated in FIG. 6 corresponds to the arrangement of the heat transport unit 400 illustrated in FIG. 1. The configuration of a cooling unit 500 included in the heat transport unit 400B is the same as the configuration described with reference to FIGS. 2A to 2C. In FIG. 6, the same reference numerals as the reference numerals in FIGS. 1 to 5 are given to the components that are the same as the components illustrated in FIGS. 1 to 5.

FIG. 6 is compared with FIG. 5. FIG. 6 differs from FIG. 5 in that a heat dissipating opening 421 is formed in a cooling unit enclosure 420. Additionally, FIG. 6 differs from FIG. 5 in that a heat dissipating fan unit 450 is attached to the cooling unit enclosure 420.

As illustrated in FIG. 6, the heat transport unit 400B further includes the heat dissipating opening 421 and the heat dissipating fan unit 450.

The heat dissipating opening 421 is formed in the top surface of the cooling unit enclosure 420A. Air outside the heat transport unit 400B can flow into a heat-dissipating-unit housing chamber 400b through the heat dissipating opening 421.

The heat dissipating fan unit 450 is attached to the top surface of the cooling unit enclosure 420A in such a manner that the heat dissipating fan unit 450 fits into the heat dissipating opening 421.

An operation of the heat transport unit 400B will be described next.

Air (warm air) containing heat from the heat generating component 220 flows from an electronic-board housing chamber 300a into a heat-receiving-unit housing chamber 400a through a warm air outlet 320 (as indicated by arrow b in FIG. 6).

A heat receiving unit 510 of the cooling unit 500 receives heat from the heat generating component 220 which is contained in the warm air in the heat-receiving-unit housing chamber 400a. A heat dissipating unit 520 of the cooling unit 500 dissipates the heat received by the heat receiving unit 510 outside the heat transport unit 400 (as indicated by arrow P in FIG. 1).

The heat dissipating fan unit 450 draws air outside the heat transport unit 400 into the heat-dissipating-unit housing chamber 400b and provides the air to the heat dissipating unit 520 along the heat transport partition 430 (as indicated by arrow s). The heat dissipating unit 520 is provided in such a manner that a portion of the heat dissipating unit 520 is exposed to the air outside the heat transport unit 400. Accordingly, air outside the heat transport unit 400 flows through the heat dissipating unit 520 back to the outside from the heat transport unit 400. For this reason, the heat dissipating unit 520 can efficiently dissipate heat generated by the heat generating component 220.

In the heat-dissipating-unit housing chamber 400b, the enclosure partition 430 and the heat dissipating opening 421 are disposed so that air outside the heat-dissipating-unit housing chamber 400b hits the enclosure partition 430. Furthermore, the heat receiving unit 510, the enclosure partition 430, and a cool air inlet 330 are disposed so that air with heat from the heat generating component 220 that has passed through the heat receiving unit 510 hits the enclosure partition 430. This arrangement causes air (warm air) with heat from the heat generating component 220 that has passed through the heat receiving unit 510 and air (cool air) outside the heat-dissipating-unit housing chamber 400b collide with each other with the enclosure partition 430 between them. Specifically, arrangement is made such that the flow of air (warm air) with heat from the heat generating component 220 that has passed through the heat receiving unit 510 and the flow of air (cool air) outside the heat-dissipating-unit housing chamber 400b bend to hit the enclosure partition 430. Accordingly, the heat-receiving-unit housing chamber 400a side of the enclosure partition 430 first absorbs heat from air (warm air) with heat from the heat generating component 220 that has passed through the heat receiving unit 510. On the other hand, the heat-dissipating-unit housing chamber 400b side of the enclosure partition 430 cools heat absorbed by the heat-receiving-unit housing chamber 400a side of the enclosure partition 430 by using air (cool air) outside the heat-dissipating-unit housing chamber 400b. Consequently, an enhanced heat exchange effect can be achieved and heat from the heat generating component 220 that has passed through the heat receiving unit 510 can be more efficiently cooled.

As described previously, the cooling unit 500 circulates coolant COO while changing the phase of the coolant COO (between the liquid phase and the vapor phase), thereby dissipating heat generated by the heat generating component 220. Further details are as described above with reference to FIGS. 2A, 2B and 2C.

Note that while the heat dissipating fan unit 450 is provided to forcedly draw in air from outside the heat transport unit 400 and provide the drawn air along the heat transport partition 430 to the heat dissipating unit 520 in the foregoing description, the heat dissipating fan unit 450 may be omitted. In other words, air naturally drawn in through the heat dissipating opening 421 may be provided along the heat transport partition 430 to the heat dissipating unit 520 (as indicated by arrow s). In this case, the same effect described above can be achieved. Note that if it is desirable to supply more air to the heat dissipating unit 520, provision of the heat dissipating fan unit 450 is more preferable.

A configuration of a third variation 400C of the heat transport unit 400 will be described next.

Figure 7:
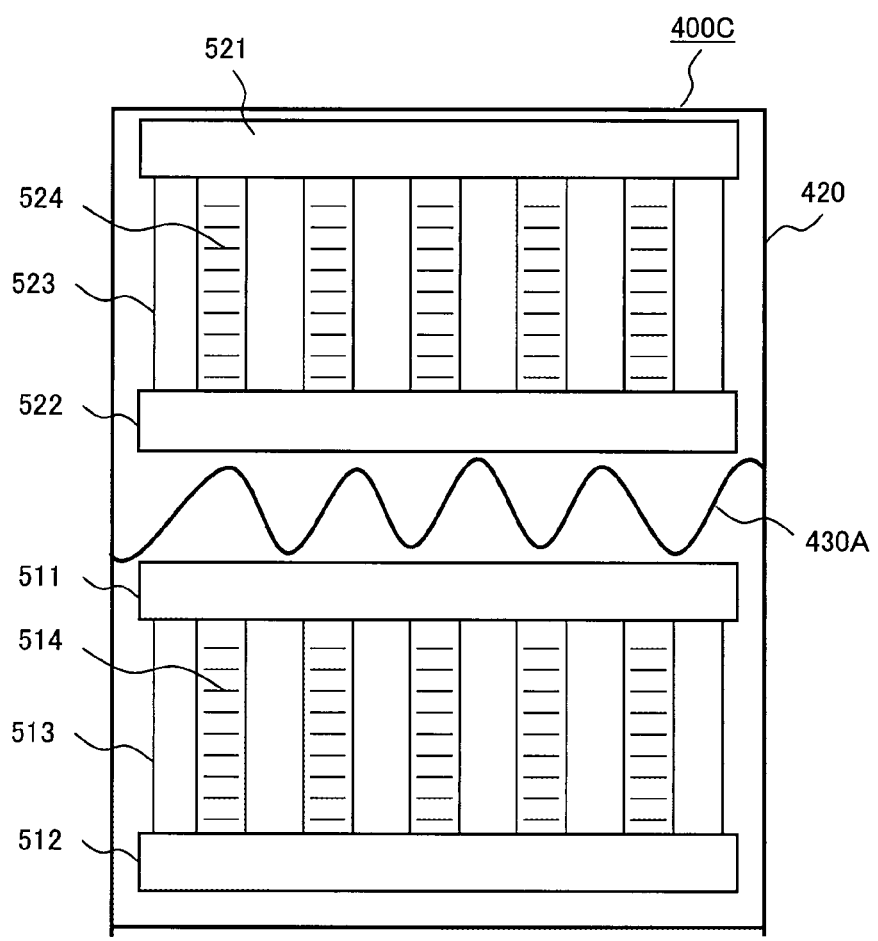
FIG. 7 is a schematic cross-sectional view illustrating a configuration of a third variation of the heat transport unit.

FIG. 7 is a schematic cross-sectional view illustrating a configuration of the third variation 400C of the heat transport unit 400. FIG. 7 is a view on arrow L in FIG. 2.

Note that the arrangement of the heat transport unit 400C illustrated in FIG. 7 is the same as the arrangement of the heat transport unit 400 illustrated in FIG. 1. The configuration of a cooling unit 500 included in the heat transport unit 400C is the same as the configuration described with reference to FIGS. 2A to 2C. In FIG. 7, the same reference numerals as the reference numerals in FIGS. 1 to 6 are given to the components that are the same as the components illustrated in FIGS. 1 to 6.

The heat transport unit 400 illustrated in FIGS. 1 and 2A to 2C is compared with the heat transport unit 400C illustrated in FIG. 7. In the heat transport unit 400, the heat transport partition 430 is formed into a flat plate. The heat transport partition 430A, on the other hand, is formed into a wavy plate. The heat transport unit 400C differs from the heat transport unit 400 in this respect.

The heat transport partition 430A formed into a wavy plate in this way has a larger surface area in contact with air in the heat-receiving-unit housing chamber 400a than a heat transport partition formed into a flat plate. Consequently, the heat transport partition 430A, which is made of a thermally conductive material as described earlier, can efficiently cool air in the heat-receiving-unit housing chamber 400a, which is air with heat generated by a heat generating component 220.

Similarly, the heat transport partition 430A formed into a wavy plate has a larger surface area in contact with air in the heat-dissipating-unit housing chamber 400b than a heat transport partition formed into a flat plate. Consequently, the heat transport partition 430A, which is made of a thermally conductive material as described earlier, can efficiently cool air in the heat-dissipating-unit housing chamber 400b, which is air with heat of the heat generating component 220 provided from the heat receiving unit 510.

As described above, an electronic device 100 according to the first exemplary embodiment of the present invention includes an electronic board 200, an enclosure 300, a heat transport unit 400, a heat receiving unit 510, a heat dissipating unit 520, and a guide duct unit 340. A heat generating component 220 is mounted on the electronic board 200. The enclosure 300 houses the electronic board 200. The heat transport unit 400 is coupled to the enclosure 300 and transports heat generated by the heat generating component 220 to the outside. The heat receiving unit 510 is provided inside the heat transport unit 400. The heat receiving unit 510 receives heat generated by the heat generating component 220. The heat dissipating unit 530 is provided in the heat transport unit 400 in such a manner that a portion of the heat dissipating unit 530 is exposed outside, and is coupled to the heat receiving unit 510. The heat dissipating unit 530 dissipates heat received by the heat receiving unit 510 to the outside. The guide duct unit 340 is formed by interconnecting the heat generating component 220 and the heat receiving unit 510 in a tubular form in order to send heat generated by the heat generating component 220 to the heat receiving unit 510.

In this way, in the heat transport unit 400, the heat receiving unit 510 receives heat generated by the heat generating component 220 in the enclosure 300 and the heat dissipating unit 520 dissipates the heat generated by the heat generating component 220 received by the heat receiving unit 510 to the outside. The guide duct unit 340 is formed by interconnecting the heat generating component 220 and the heat receiving unit 510 in a tubular form. Accordingly, air containing heat generated by the heat generating component 220 flows through the guide duct unit 340 directly into the heat receiving unit 510 in the heat-receiving-unit housing chamber 410a without being affected by obstacles which can act as resistance to air. For this reason, in the electronic device 100 in the first exemplary embodiment of the present invention, air containing heat generated by the heat generating component 220 can be efficiently flowed into the heat receiving unit 510. Consequently, the heat receiving unit 510 can efficiently receive heat generated by the heat generating component 220 and the heat dissipating unit 520 can efficiently receive heat of the heat generating component 220 received by the heat receiving unit 510. Note that the techniques described in PTL 1 to PTL 3 require provision of dedicated equipment for circulating the coolant into the cooling module, which adds to structural complexity. The cooling unit 500 of the present invention, in contrast, can be fabricated with a small and simple configuration because the cooling unit 500 is made up of the heat receiving unit 510 and the heat dissipating unit 520. Thus, the electronic device 100 in the first exemplary embodiment of the present invention enables efficient cooling of the heat generating component 220 on the electronic board 200 with a small and simple configuration.

Furthermore, the electronic device 100 in the first exemplary embodiment of the present invention includes a heat-receiving-unit housing chamber 400a, a heat-dissipating-unit housing chamber 400b and a heat transport partition 430. The heat-receiving-unit housing chamber 400a is provided inside the heat transport unit 400 and houses the heat receiving unit 510. The heat-dissipating-unit housing chamber 300b is provided inside the heat transport unit 400 and houses the heat dissipating unit 520. The heat transport partition 430 is provided between the heat-receiving-unit housing chamber 400a and the heat-dissipating-unit housing chamber 400b to prevent air from flowing back and forth between the heat-receiving-unit housing chamber 400a and the heat-dissipating-unit housing chamber 400b.

In this way, the heat receiving unit 510 and the heat dissipating unit 520 are housed in separate chambers. Furthermore, the heat-receiving-unit housing chamber 400a housing the heat receiving unit 510 and the heat-dissipating-unit housing chamber 400b housing the heat dissipating unit 520 are provided in such a manner that the heat transport partition 430 prevents air from flowing back and forth between the heat-receiving-unit housing chamber 400a and the heat-dissipating-unit housing chamber 400b. Accordingly, heat from the heat generating component 220 which fills the heat-receiving-unit housing chamber 400a can be prevented from flowing into the heat dissipating unit 520 without flowing through the heat receiving unit 510. Consequently, the heat generating component 220 on the electronic board 200 can be efficiently cooled.

In the electronic device 100 in the first exemplary embodiment of the present invention, the heat transport partition 430 is disposed so that air containing heat generated by the heat generating component 220 passes through the heat receiving unit 510 and then flows back into the enclosure 300. This can smoothly circulates air between the heat receiving unit 510 in the heat transport unit 400 and the heat generating component 220 in the enclosure 300.

In an electronic device 100 in the first exemplary embodiment of the present invention, a heat transport unit 400B includes a heat dissipating opening 421. The heat dissipating opening 421 is provided for providing air outside the heat transport unit 400B to a heat dissipating unit 520. Air outside the heat transport unit 400B which flows through a heat dissipating opening 450 flows along the heat transport partition 430 into the heat dissipating unit 520. Thus, air outside the heat transport unit 400B efficiently flows into the heat dissipating unit 520. Accordingly, the heat dissipating unit 520 can use air outside the heat transport unit 400B to efficiently cool heat from the heat generating component 220 flowed by the heat receiving unit 510.

In an electronic device 100 in the first exemplary embodiment of the present invention, a heat transport unit 400A includes a heat receiving unit holder 440. The heat receiving unit holder 440 is provided along a periphery of a heat receiving unit 510. The heat receiving unit holder 440 holds the periphery of the heat receiving unit 510. The heat receiving unit holder 440 is provided so that passage of air is prevented between the periphery of the heat receiving unit 510 and the heat transport partition 430 and between the periphery of the heat receiving unit 510 and an inner wall of the heat transport unit 400A.

In this way, the heat receiving unit holder 440 is provided between the periphery of the heat receiving unit 510 and the heat transport partition 430 and between the periphery of the heat receiving unit 510 and the inner wall of the heat transport unit 400A so that passage of air does not occur. This can prevent air containing heat generated by the heat generating component 220 from flowing into a heat-dissipating-unit housing chamber 400b without passing through the heat receiving unit 510. Consequently, the heat generating component 220 on the electronic board 200 can be cooled with an enhanced efficiency.

In an electronic device 100 in the first exemplary embodiment of the present invention, the heat transport partition 430A is formed into a wavy plate.

The heat transport partition 430A formed into a wavy plate in this way has a larger surface area in contact with air in the heat-receiving-unit housing chamber 400a than a heat transport partition formed into a flat plate. Consequently, the heat transport partition 430A, which is made of a thermally conductive material as described earlier, can efficiently cool air in the heat-receiving-unit housing chamber 400a, which is air with heat generated by the heat generating component 220.

Similarly, the heat transport partition 430A formed into a wavy plate has a larger surface area in contact with air in the heat-dissipating-unit housing chamber 400b than a heat transport partition formed into a flat plate. Consequently, the heat transport partition 430A, which is made of a thermally conductive material as described earlier, can efficiently cool air in the heat-dissipating-unit housing chamber 400b, which is air with heat of the heat generating component 220 provided from the heat receiving unit 510.

Accordingly, by forming the heat transport partition 430A into a wavy plate, the heat generating component 220 on the electronic board 200 can be cooled with an enhanced efficiency.

An electronic device 100 in the first exemplary embodiment of the present invention includes a connector unit 260. The connector unit 260 is connected to an electronic board 200 and is exposed outside the enclosure 300. The connector unit 260 is covered with a heat transport unit 400. This can protect the connector unit 260 from dust and dirt.

In an electronic device 100 in the first exemplary embodiment of the present invention, an enclosure 300 includes an electronic-board housing chamber 300a (heat generating component housing chamber), an air guide chamber 300b, an enclosure partition 310, a warm air outlet 320 (first opening), a cool air inlet 330 (second opening), and communicating holes 360a, 360b (third opening). The electronic-board housing chamber 300a houses a heat generating component 220. The air guide chamber 300b forms an air flow path between the heat-receiving-unit housing chamber 400a and the electronic-board housing chamber 300a. The enclosure partition 310 is provided between the electronic-board housing chamber 300a and the air guide chamber 300b and separates the electronic-board housing chamber 300a from the air guide chamber 300b. The warm air outlet 320 communicates between the electronic-board housing chamber 300a and the heat-receiving-unit housing chamber 400a. The cool air inlet 330 communicates between the heat-receiving-unit housing chamber 400a and the air guide chamber 300b. The communicating holes 360a, 360b are formed in the enclosure partition 310 and communicate between the electronic-board housing chamber 300a and the air guide chamber 300b. An air flow path is formed through which air circulates among the electronic-board housing chamber 300a, the heat-receiving-unit housing chamber 400b, and the air guide chamber 300b through the warm air outlet 320, the cool air inlet 330, and the communicating holes 360a, 360b. The guide duct unit 340 includes a portion of the enclosure partition 310.

In this way, in the electronic device 100, the enclosure partition 310 is used to divide the enclosure 300 into two chambers: the electronic-board housing chamber 300a and the air guide chamber 300b. Furthermore, the warm air outlet 320, the cool air inlet 330, and the communicating holes 360a, 360b are formed in the enclosure 300. This enables air to smoothly circulate among the electronic-board housing chamber 300a, the heat-receiving-unit housing chamber 400a and the air guide chamber 300b. Furthermore, since a portion of the enclosure partition 310 is used to form the guide duct unit 340, the number of parts can be reduced.

An electronic device 100 according to the first exemplary embodiment of the present invention includes a heat-generating-component fan unit 250. The heat-generating-component fan unit 250 is provided inside an electronic-board housing chamber 300a. The heat-generating-component fan unit 250 accelerates flow of heat generated by the heat generating component 220 into a guide duct unit 340. In this way, heat generated by the heat generating component 220 can be directly flowed into the guide duct unit 340 by the heat-generating-component fan unit 250. This enables heat generated by the heat generating component 220 to flow into the heat receiving unit 510 with high efficiency. Accordingly, the heat receiving unit 510 can efficiently receive heat of the heat generating component 220 flowed through the guide duct unit 340.

In an electronic device 100 in the first exemplary embodiment of the present invention, a heat transport unit 400 contains coolant COO circulating between a heat receiving unit 510 and a heat dissipating unit 520. The heat receiving unit 510 receives heat generated by a heat generating component 220 and transmits the received heat to the coolant COO. The heat dissipating unit 520 condenses the coolant COO flowed from the heat receiving unit 510. By using the coolant COO in this way, heat generated by the heat generating component 220 can be efficiently transmitted from the heat receiving unit 510 to the heat dissipating unit 520.

An electronic device 100 in the first exemplary embodiment of the present invention includes a vapor pipe 530 and a liquid pipe 540. The vapor pipe 530 interconnects a heat receiving unit 510 and a heat dissipating unit 520. The vapor pipe 530 transports coolant COO vaporized in the heat receiving unit 510 from the heat receiving unit 510 to the heat dissipating unit 520. The liquid pipe 540 interconnects the heat receiving unit 510 and the heat dissipating unit 520. The liquid pipe 540 transports coolant COO condensed and liquefied in the heat dissipating unit 520 from the heat dissipating unit 520 to the heat receiving unit 510. The connection between the vapor pipe 530 and the heat dissipating unit 520 is positioned higher than the connection between the liquid pipe 540 and the heat receiving unit 510 in the vertical direction G and the connection between the vapor pipe 530 and the heat dissipating unit 520 is positioned higher than the connection between the liquid pipe 540 and the heat dissipating unit 520 in the vertical direction G.

This causes coolant COO vaporized in the heat receiving unit 510 by heat generated by the heat generating component 220 to smoothly flow upward in the vapor pipe 530 in the vertical direction G. Then the coolant COO condensed and liquefied in the heat dissipating unit 520 flows in the heat dissipating unit 520 downward in the vertical direction G. The coolant COO which has flowed in the heat dissipating unit 520 downward in the vertical direction G then flows through the liquid pipe 540 into the heat receiving unit 510. Then the process described above is repeated. Thus, the coolant COO in the cooling unit 500 can be smoothly circulated between the heat receiving unit 510 and the heat dissipating unit 520.

A cooling system in the first exemplary embodiment of the present invention includes an enclosure 300, a heat transport unit 400, a heat receiving unit 510, a heat dissipating unit 520, and a guide duct unit 340. The enclosure 300 houses an electronic board 200 on which a heat generating component 220 is mounted. The heat transport unit 400 is coupled to the enclosure 300 and transports heat generated by the heat generating component 220 to the outside. The heat receiving unit 510 is provided inside the heat transport unit 400. The heat receiving unit 510 receives heat generated by the heat generating component 220. The heat dissipating unit 530 is provided in such a manner that a portion of the heat dissipating unit 530 is exposed outside, and is coupled to the heat receiving unit 510. The heat dissipating unit 530 dissipates heat received by the heat receiving unit 510 to the outside. The guide duct unit 340 is formed by interconnecting the heat generating component 220 and the heat receiving unit 510 in a tubular form in order to send heat generated by the heat generating component 220 to the heat receiving unit 510.

In this way, in the heat transport unit 400, the heat receiving unit 510 receives heat generated by the heat generating component 220 in the enclosure 300 and the heat dissipating unit 520 dissipates heat of the heat generating component 220 received by the heat receiving unit 510 to the outside. The guide duct unit 340 is formed by interconnecting the heat generating component 220 and the heat receiving unit 510 in a tubular form. Accordingly, air containing heat generated by the heat generating component 220 flows through the guide duct unit 340 directly into the heat receiving unit 510 in the heat-receiving-unit housing chamber 410a without being affected by obstacles which can act as resistance to air. In this way, in the electronic device 100 in the first exemplary embodiment of the present invention, air containing heat generated by the heat generating component 220 can be efficiently flowed into the heat receiving unit 510. Consequently, the heat receiving unit 510 can efficiently receive heat generated by the heat generating component 220 and the heat dissipating unit 520 can efficiently receive heat of the heat generating component 220 received by the heat receiving unit 510. Note that the techniques described in PTL 1 to PTL 3 require provision of dedicated equipment for circulating the coolant into the cooling module, which adds to structural complexity. The cooling unit 500 of the present exemplary embodiment, in contrast, can be fabricated with a small and simple configuration because the cooling unit 500 is made up of the heat receiving unit 510 and the heat dissipating unit 520. Thus, the electronic device 100 in the first exemplary embodiment of the present invention enables efficient cooling of the heat generating component 220 on the electronic board 200 with a small and simple configuration.

Second Exemplary Embodiment

A configuration of an electronic device 100A in a second exemplary embodiment of the present invention will be described with reference to drawings.

FIG. 8 is a side perspective view illustrating a configuration of the electronic device 100A in the second exemplary embodiment of the present invention, viewed from a side. Note that the vertical direction G is illustrated in FIG. 8 for convenience of explanation. In FIG. 8, the same reference numerals as the reference numerals in FIGS. 1 to 7 are given to the components that are the same as the components illustrated in FIGS. 1 to 7.

As illustrated in FIG. 8, the electronic device 100A includes an electronic board 200A, an enclosure 300A, and a heat transport unit 400.

Note that the arrangement of the heat transport unit 400 illustrated in FIG. 8 is the same as the arrangement of the heat transport unit 400 illustrated in FIG. 1. In place of the heat transport unit 400, any of the heat transport units 400A to 400C may be attached to the enclosure 300A.

Compare FIG. 8 with FIG. 1. In FIG. 1, the electronic board 200 is disposed in the enclosure 300 in such a manner that the plane of the electronic board 200 is substantially perpendicular to the vertical direction G. In FIG. 8, on the other hand, the electronic board 200A is disposed in the enclosure 300A in such a manner that the plane of the electronic board 200A is substantially parallel to the vertical direction G.

Accordingly, in FIG. 8, the arrangement of a heat generating component 220, memories 230a, 230b, an HDD 240, a heat-generating-component fan unit 250, an enclosure partition 310, a guide duct unit 340 and an air guide fan unit 350 is different from the arrangement illustrated in FIG. 1.

As will be detailed later, the arrangement of a heat receiving unit 510 and a heat dissipating unit 520 included in a cooling unit 500A of the heat transport unit 400A is different from the arrangement of the heat receiving unit 510 and the heat dissipating unit 520 included in the cooling unit 500 of the heat transport unit 400.

The electronic board 200A and the enclosure 300A will be described below in detail with reference to drawings. Note that the heat transport unit 400 is as described with reference to FIG. 1 and therefore detailed description of which will be omitted.

The enclosure 300A and the heat transport unit 400 can be detached from each other along plane H-H in FIG. 8. In other words, the heat transport unit 400 is detachably attached to the enclosure 300A along plane H-H. As illustrated in FIG. 8, the plane of the electronic board 200A is positioned substantially parallel to the vertical direction G.

A configuration of the electronic board 200A will be described first. The electronic board 200A includes a substrate 210A, a heat generating component 220, memories 230, an HDD 240, a heat-generating-component fan unit 250 and a connector unit 260. Details of the materials and functions of these components are as described in the first exemplary embodiment.

As illustrated in FIG. 8, the heat generating component 220, the memories 230, the HDD 240 and the heat-generating-component fan unit 250 are provided on one of the main surfaces of the substrate 210A.

As illustrated in FIG. 8, the heat-generating-component fan unit 250 and the heat generating component 220 are disposed close to each other in such a manner that the heat-generating-component fan unit 250 faces the heat generating component 220. The heat-generating-component fan unit 250 accelerates circulation of air between a heat-generating-component housing chamber 300c, a heat-receiving-unit housing chamber 400a, and an air guide chamber 300b, which will be described later.

The configuration of the electronic board 200A has been described so far.

A configuration of the enclosure 300A will be described next. As illustrated in FIG. 8, the enclosure 300A hermetically houses the electronic board 200A.

As illustrated in FIG. 8, the enclosure 300A is divided into two chambers by an enclosure partition 310. Specifically, the enclosure 300A includes the heat-generating-component housing chamber 300c and the air guide chamber 300d.

In FIG. 1, the electronic-board housing chamber 300a houses the entire electronic board 200 including the heat generating component 220. In FIG. 8, in contrast, the heat-generating-component housing chamber 300c does not house the entire electronic board 200A but only a region of the electronic board 200A that includes the heat generating component 220.

As illustrated in FIG. 8, the enclosure partition 310 is provided between the heat-generating-component housing chamber 300c and the air guide chamber 300d and separates the heat-generating-component housing chamber 300c from the air guide chamber 300d.

As illustrated in FIG. 8, the heat-generating-component housing chamber 300c houses the heat generating component 220 on the electronic board 200A. The air guide chamber 300d houses the air guide fan unit 350. However, the air guide fan unit 350 may be omitted. The air guide chamber 300d forms an air flow path between the heat-receiving-unit housing chamber 400a in the heat transport unit 400 and the heat-generating-component housing chamber 300c. More specifically, the air guide chamber 300d guides air flowing out from the heat-receiving-unit housing chamber 400a into the heat-generating-component housing chamber 300c.

As illustrated in FIG. 8, the enclosure 300A includes an enclosure partition 310, a warm air outlet 320, a cool air inlet 330, a guide duct unit 340 and communicating holes 360a, 360b.

As illustrated in FIG. 8, the warm air outlet 320 and the cool air inlet 330 are formed along plane H-H which joins the heat transport unit 400.

The warm air outlet 320 is formed between the heat-generating-component housing chamber 300c and the heat receiving unit 510 in the heat transport unit 400. The warm air outlet 320 communicates between the heat-generating-component housing chamber 300c and the heat-receiving-unit housing chamber 400a.

As illustrated in FIG. 8, the heat generating component 220 is disposed in such a manner that the heat generating component 220 faces the warm air outlet 320. This allows air with heat from the heat generating component 220 flows through the warm air outlet 320 directly into the heat-receiving-unit housing chamber 400a. Accordingly, air with heat from the heat generating component 220 can be efficiently flowed into the heat-receiving-unit housing chamber 400a.

The heat generating component 220 is disposed between the heat-generating-component fan unit 250 and the warm air outlet 320. This allows heat generated by the heat generating component 220 to be directly cooled by the heat-generating-component fan unit 250. Furthermore, air blown by the heat-generating-component fan unit 250 absorbs heat from the heat generating component 220, becomes warm air, and flows through the warm air outlet 320 into the heat-receiving-unit housing chamber 400a.

The cool air inlet 330 is formed between the air guide chamber 300d and the heat-receiving-unit housing chamber 400a in the heat transport unit 400. The cool air inlet 330 communicates between the heat-receiving-unit housing chamber 400a and the air guide chamber 300d.

In this way, the warm air outlet 320 and the cool air inlet 330 are separately formed in the enclosure 300A. This can prevent mixing of warm air flowing from the heat-generating-component housing chamber 300c into the heat-receiving-unit housing chamber 400a and cool air flowing from the heat-receiving-unit housing chamber 400a into the air guide chamber 300d.

As illustrated in FIG. 8, the guide duct unit 340 is formed by interconnecting the heat generating component 220 and the heat receiving unit 510 in a tubular form in order to send heat generated by the heat generating component 220 to the heat receiving unit 510 in the heat-receiving-unit housing chamber 400a. The guide duct unit 340 in FIG. 8 includes a portion of the enclosure partition 310. However, the configuration is not limited to this and the guide duct unit 340 may be provided completely separately from the enclosure partition 310.

As illustrated in FIG. 8, the guide duct unit 340 connects to the heat-receiving-unit housing chamber 400a through the warm air outlet 320. Note that no other electronic components that act as resistance to air are provided between the heat generating component 220 and the warm air outlet 320 as illustrated in FIG. 8. In this way, air with heat from the heat generating component 220 flows through the guide duct unit 340 directly into the heat receiving unit 510 in the heat-receiving-unit housing chamber 410a without being affected by obstacles that can act as resistance to air. Accordingly, air with heat from the heat-generating component 220 can be efficiently flowed into the heat receiving unit 510. Consequently, the heat receiving unit 510 can efficiently receive heat from the heat generating component 220.

As illustrated in FIG. 8, the air guide fan unit 350 is attached on the electronic board 200A in the air guide chamber 300d. The air guide fan unit 350 draws air from the heat-receiving-unit housing chamber 400a of the heat transport unit 400 into the air guide chamber 300d and causes the drawn air to flow back into the heat-generating-component housing chamber 300c as illustrated in FIG. 8. Furthermore, in conjunction with the heat-generating-component fan unit 250, the air guide fan unit 350 accelerates circulation of air between the heat-generating-component housing chamber 300c, the heat-receiving-unit housing chamber 400a and the air guide chamber 300d.

As illustrated in FIG. 8, the communicating holes 360a, 360b are formed in the enclosure partition 310. The communicating holes 360a, 360b communicate between the heat-generating-component housing chamber 300c and the air guide chamber 300d. Accordingly, air in the heat-generating-component housing chamber 300c and air in the air guide chamber 300d can flow in and out through the communicating holes 360a, 360b.

The configuration of the enclosure 300A has been described so far.

A configuration of the heat transport unit 400 will be described next.

As illustrated in FIG. 8, the heat transport unit 400 includes a cooling unit 500A, a cooling unit enclosure 420, and a heat transport partition 430. The heat transport unit 400 is coupled to the enclosure 300 and transports and dissipates heat from the heat-generating component 220 to the outside (outside the enclosure 300 and outside the heat transport unit 400). The heat transport unit 400 in FIG. 8 has basically the same configuration as the heat transport unit 400 in FIG. 1.

However, the arrangement of the heat receiving unit 510 and the heat dissipating unit 520 included in the cooling unit 500A illustrated in FIG. 8 differs from the arrangement of the heat receiving unit 510 and the heat dissipating unit 520 included in the cooling unit 500 illustrated in FIG. 1.

Figure 9A:
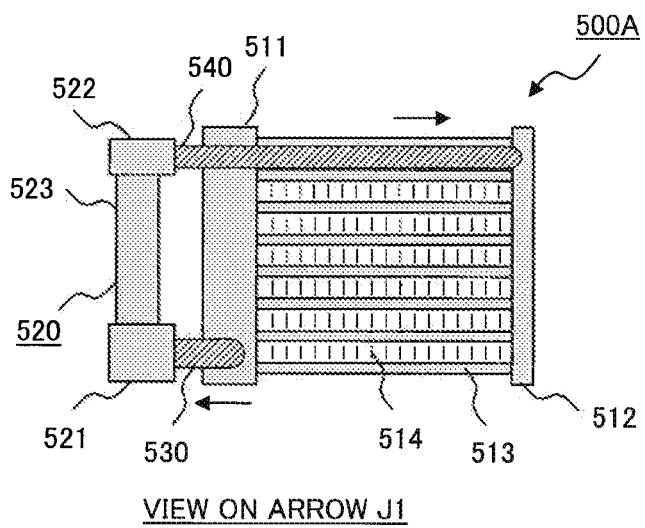
FIG. 9A is a diagram illustrating a configuration of a cooling unit in a heat transport unit and is a top view of the cooling unit.
Figure 9B:
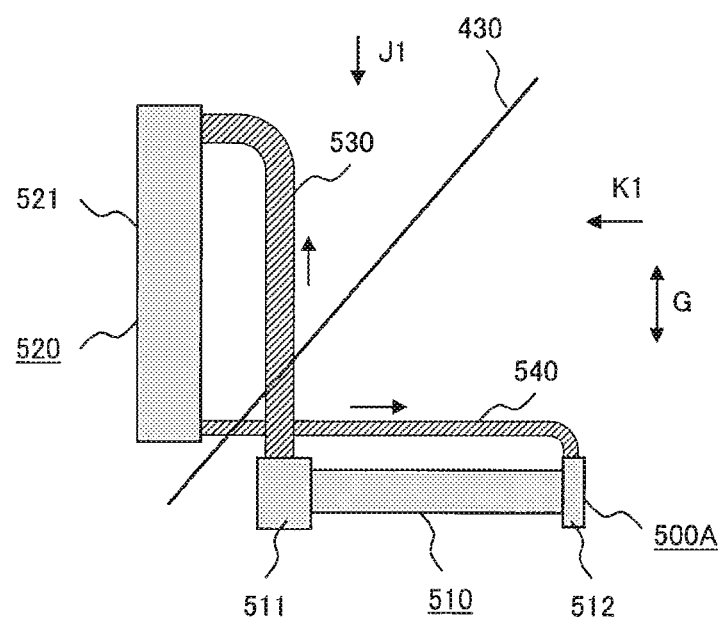
FIG. 9B is a diagram illustrating the configuration of the cooling unit in the heat transport unit and is a front view of the cooling unit.
Figure 9C:
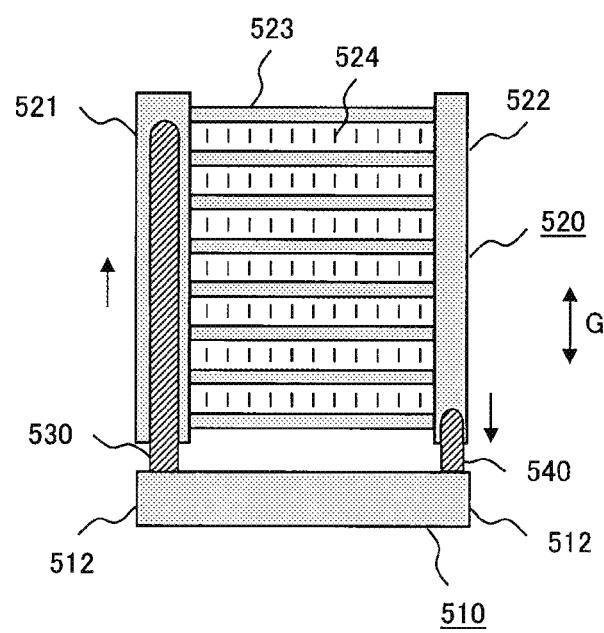
FIG. 9C is a diagram illustrating the configuration of the cooling unit in the heat transport unit and is a side view of the cooling unit.

FIG. 9A is a diagram illustrating a configuration of the cooling unit 500A in the heat transport unit 400A and is a top view of the cooling unit 500A. FIG. 9B is a diagram illustrating the configuration of the cooling unit 500A in the heat transport unit 400A and is a front view of the cooling unit 500A. FIG. 9C is a diagram illustrating the configuration of the cooling unit 500A in the heat transport unit 400A and is a side view of the cooling unit 500A. The arrangement of the heat receiving unit 510 and the heat dissipating unit 520 in FIG. 9B corresponds to the arrangement in FIG. 8. FIG. 9A illustrates a view on arrow J1 in FIG. 9B. FIG. 9C illustrates a view on arrow K1 in FIG. 9B. The vertical direction G is indicated in FIGS. 9B and 9C. FIG. 9B also depicts the heat transport partition 430 for convenience of explanation.

The cooling unit 500A illustrated in FIGS. 9A to 9C is compared with the cooling unit 500 illustrated in FIGS. 2A to 2C. As illustrated in FIG. 2C, connecting pipe units 523 of the heat dissipating unit 520 in the cooling unit 500 are arranged substantially parallel to the vertical direction G. Additionally, connecting pipe units 513 of the heat receiving unit 510 in the cooling unit 500 are arranged substantially parallel to the connecting pipe units 523 of the heat dissipating unit 520 as illustrated in FIGS. 2A and 2C.

On the other hand, connecting pipe units 523 of the heat dissipating unit 520 in the cooling unit 500A are arranged in a direction substantially perpendicular to the vertical direction G as illustrated in FIG. 9C. Furthermore, connecting pipe units 513 of the heat receiving unit 510 in the cooling unit 500A are arranged in a direction substantially perpendicular to the connecting pipe units 523 of the heat dissipating unit 520 as illustrated in FIGS. 9A and 9C.

As illustrated in FIGS. 9A, 9B and 9C, the heat receiving unit 510 includes a vapor-pipe connecting tank unit 511, a liquid-pipe connecting tank unit 512, a plurality of connecting pipe units 513, and a plurality of heat-receiving-unit fin units 514. Connections and functions of the components are the same as those described with reference to FIGS. 2A to 2C.

As illustrated in FIGS. 9A, 9B and 9C, the heat dissipating unit 520 includes a vapor-pipe connecting tank unit 521, a liquid-pipe connecting tank unit 522, a plurality of connecting pipe units 523, and a plurality of heat-dissipating-unit fin units 524. Connections and functions of the components are the same as those described with reference to FIGS. 2A to 2C.

The connection between the vapor pipe 530 and the heat dissipating unit 520 is positioned higher than the connection between the liquid pipe 540 and the heat receiving unit 510 and higher than the connection between the liquid pipe 540 and the heat dissipating unit 510 in the vertical direction G. This arrangement is the same as in the cooling unit 500 illustrated in FIGS. 2A to 2C.

Specifically, as illustrated in FIGS. 9A, 9B and 9C, the connection between the vapor pipe 530 and the vapor-pipe connecting tank unit 521 of the heat dissipating unit 520 is positioned higher than the connection between the liquid pipe 540 and the liquid-pipe connecting tank unit 512 of the heat receiving unit 510 in the vertical direction G. Additionally, the connection between the vapor pipe 530 and the vapor-pipe connecting tank unit 521 of the heat dissipating unit 520 is positioned higher than the connection between the liquid pipe 540 and the liquid-pipe connecting tank unit 522 of the heat dissipating unit 520 in the vertical direction G.

The cooling unit 500A operates in the same way as the cooling unit 500 described above does. Accordingly, coolant COO in the cooling unit 500 can be smoothly circulated between the heat receiving unit 510 and the heat dissipating unit 520. Specifically, the coolant COO which has been vaporized in the heat receiving unit 510 by heat generated by the heat generating component 220 smoothly flows in the vapor pipe 530 upward in the vertical direction G. Then the coolant COO condensed and liquefied in the heat dissipating unit 520 flows downward in the vertical direction G in the heat dissipating unit 520. The coolant COO which has flowed in the heat dissipating unit 520 downward in the vertical direction G flows through the liquid pipe 540 into the heat receiving unit 510. Then the process described above is repeated.

The configuration and operation of the cooling unit 500A have been described so far.

An operation of the electronic device 100A will be described next with reference to drawings.

First, when the electronic device 100A is powered on, the heat generating component 220 generates heat. As illustrated in FIG. 8, heat generated by the heat generating component 220 is carried by air in the enclosure 300A blown by the heat-generating-component fan unit 250 and travels through the guide duct unit 340 provided in the heat-generating component housing chamber 300c toward the heat-receiving-unit housing chamber 400a (as indicated by arrow a1 in FIG. 8). In this way, air containing heat generated by the heat generating component 220 flows through the guide duct unit 340 directly into the heat receiving unit 510 in the heat-receiving-unit housing chamber 400a without being affected by obstacles that can act as resistance to air. Accordingly, air with heat from the heat-generating component 220 can be efficiently flowed into the heat receiving unit 510. Consequently, the heat receiving unit 510 can efficiently receive heat from the heat generating component 220.

Then air (warm air) containing heat generated by the heat generating component 220 flows from the heat-generating-component housing chamber 300c through the warm air outlet 320 into the heat-receiving-unit housing chamber 400a (as indicated by arrow b1 in FIG. 8).

Then the heat receiving unit 510 of the cooling unit 500A receives heat from the heat generating component 220 which is contained in the warm air in the heat-receiving-unit housing chamber 400a. The heat dissipating unit 520 of the cooling unit 500A dissipates the heat received by the heat receiving unit 510 outside the heat transport unit 400 (indicated by arrow P in FIG. 8). Since the heat dissipating unit 520 is provided in such a manner that a portion of the heat dissipating unit 520 is exposed outside the heat transport unit 400, dissipated heat does not fill the heat-receiving-unit housing chamber 400a. Accordingly, the heat dissipating unit 520 can efficiently dissipate heat generated by the heat generating component 220.

The cooling unit 500A circulates the coolant COO while changing the phase of the coolant COO (between the liquid phase and the vapor phase), thereby dissipating heat generated by the heat generating component 220. Further details are as described above with reference to FIGS. 2A, 2B and 2C.

Then air in the heat-receiving-unit housing chamber 400a flows from the heat-receiving-unit housing chamber 400a through the cool air outlet 330 into the air guide chamber 300d (as indicated by arrow c1). While air flowing through the warm air outlet 330 into the heat-receiving-unit housing chamber 400a in the direction indicated by arrow b1 contains heat generated by the heat generating component 220, the heat generated by the heat generating component 220 is dissipated by the cooling unit 500A. Thus air (warm air) flowing through the warm air outlet 330 into the heat-receiving-unit housing chamber 400a in the direction indicated by arrow b1 is cooled by the cooling unit 500A. Accordingly, the temperature of the air (cool air) flowing through the cool air outlet 330 into the air guide chamber 300d in the direction indicated by arrow c1 is lower than the temperature of the air (warm air) passing through the warm air outlet 320 in the direction indicated by arrow b1. In this way, forming the warm air outlet 320 and the cool air inlet 330 separately can prevent mixing of warm air flowing from the heat-generating-component housing chamber 300c into the heat-receiving-unit housing chamber 400a and cool air flowing from the heat-receiving-unit housing chamber 400a into the air guide chamber 300d.

Then, air flowing from the heat-receiving-unit housing chamber 400a into the air guide chamber 300d is moved in the air guide chamber 300d in the direction indicated by arrow d1 by the air guide fan unit 350 and flows through the communicating units 360a, 360b back into the heat-generating-component housing chamber 300c (as indicated by arrows e1 and f1). While two communicating units 360a, 360b are provided in the enclosure partition 310, one communicating unit 360b may be provided in the enclosure partition 310. Alternatively, three or more communicating units may be provided in the enclosure partition 310.

Air passing through the communicating unit 360a cools the memories 230a, 230b. Air passing through the communicating unit 360b cools the HDD 240 and merges with the air that has passed through the communicating unit 360a. The air that has passed through the communicating units 360a, 360b is blown by the heat-generating-component fan unit 250 to flow back to the heat generating component 220 (as indicated by arrow g1).

In this way, air containing heat generated by the heat generating component 220 is circulated by the heat-generating-component fan unit 250 and the air guide fan unit 350 through the heat-generating-component housing chamber 300c, the heat-receiving-unit housing chamber 400a and the air guide chamber 300d in this order. In other words, the air containing heat generated by the heat generating component 220 flows through the heat-generating-component housing chamber 300c, the heat-receiving-unit housing chamber 400a and the air guide chamber 300d back into the heat-generating-component housing chamber 300c. This can exhaust heat generated by the heat generating component 220 from the sealed enclosure 300A and the heat transport unit 400 to the outside. Thus the electronic device 100A enables efficient cooling.

The operation of the electronic device 100A has been described so far.

Figure 10A:
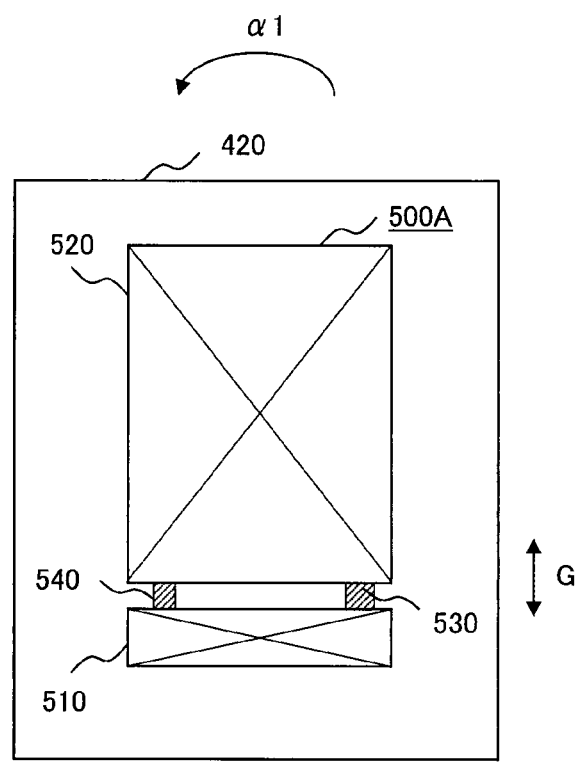
FIG. 10A is a view on arrow B1 in FIG. 8 and is a schematic side view of the cooling unit before the orientation of the electronic device in the second exemplary embodiment of the present invention is changed.
Figure 10B:
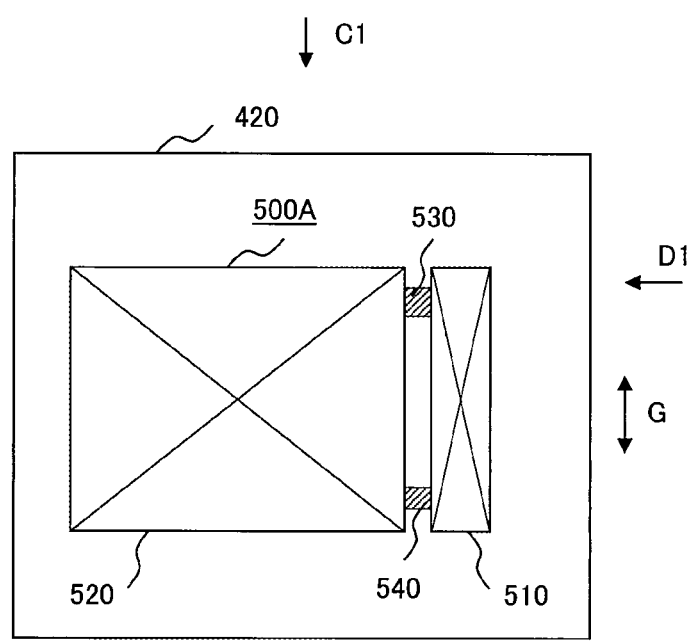
FIG. 10B is a schematic side view of the cooling unit after the orientation of the electronic device in the second exemplary embodiment of the present invention is changed.

A configuration and operation of a cooling unit when the orientation of the electronic device 100A has been changed will be described next. FIGS. 10A and 10B illustrate arrangements of the cooling unit 500A when the orientation of the electronic device 100A has been changed. FIG. 10A is a view on arrow B1 in FIG. 8 and is a schematic side view of the cooling unit 500A before the orientation of the electronic device 100A is changed. FIG. 10B is a schematic side view of the cooling unit 500A after the orientation of the electronic device 100A has been changed. Note that a cooling unit enclosure 420 of a heat transport unit 400A is also depicted in FIGS. 10A and 10B for convenience of explanation. The vertical direction G is indicated in FIGS. 10A and 10B. In FIG. 10, the same reference numerals as the reference numerals in FIGS. 1 to 9 are given to the components that are the same as the components illustrated in FIGS. 1 to 9.

It is assumed that the electronic device 100A has been rotated by 90 degrees in the direction indicated by al as illustrated in FIG. 10A. As illustrated in FIGS. 8 and 10A, a main surface of a heat dissipating unit 520 is positioned substantially parallel to the vertical direction G before the orientation of the electronic device 100A has been changed. On the other hand, after the orientation of the electronic device 100A has been changed as illustrated in FIG. 10B, main surfaces of both of a heat receiving unit 510 and the heat dissipating unit 520 are positioned substantially parallel to the vertical direction G.

Figure 11A:
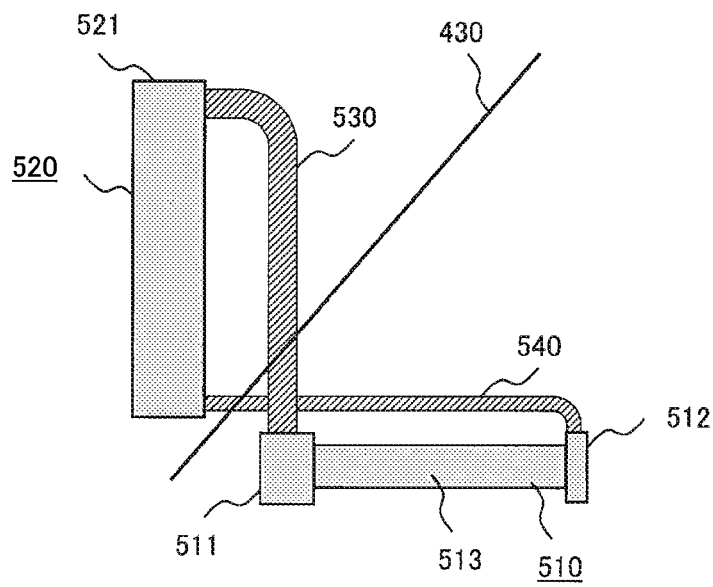
FIG. 11A is a diagram illustrating the arrangement of the cooling unit when the orientation of the electronic device in the second exemplary embodiment of the present invention has been changed and is a top view of the cooling unit.
Figure 11B:
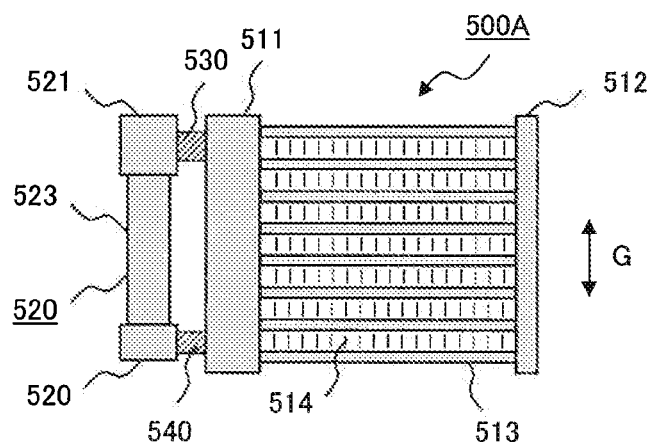
FIG. 11B is a diagram illustrating the arrangement of the cooling unit when the orientation of the electronic device in the second exemplary embodiment of the present invention has been changed and is a front view of the cooling unit.
Figure 11C:
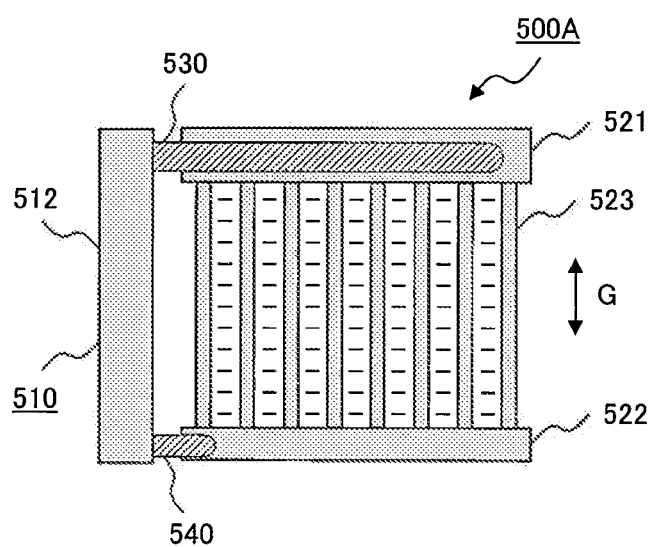
FIG. 11C is a diagram illustrating the arrangement of the cooling unit when the orientation of the electronic device in the second exemplary embodiment of the present invention has been changed and is a side view of the cooling unit.

FIGS. 11A to 11C are diagrams illustrating an arrangement of the cooling unit 500A when the orientation of the electronic device 100A has been changed. FIG. 11A is a top view of the cooling unit 500A. FIG. 11A is a view on arrow C1 in FIG. 10B. FIG. 11C is a front view of the cooling unit 500A. FIG. 11B is a view on arrow D1 in FIG. 10B. FIG. 11C is a side view of the cooling unit 500A. The vertical direction G is indicated in FIGS. 11B and 11C. A heat transport partition 430 is also depicted in FIG. 11A for convenience of explanation. In FIG. 11, the same reference numerals as the reference numerals in FIGS. 1 to 10 are given to the components that are the same as the components illustrated in FIGS. 1 to 10.

FIGS. 9A, 9B and 9C illustrate an arrangement of the cooling unit 500A before the orientation of the electronic device 100A is changed and FIGS. 11A, 11B and 11C illustrate an arrangement of the cooling unit 500A after the orientation of the electronic device 100A has been changed.

FIGS. 11A to 11C are compared with FIGS. 9A to 9C. As illustrated in FIGS. 9B and 9C, a main surface of the plate-like heat dissipating unit 520 is positioned substantially parallel to the vertical direction G before the orientation of the electronic device 100A has been changed. A main surface of the plate-like heat receiving unit 510 is positioned substantially perpendicular to the vertical direction G.

On the other hand, after the orientation of the electronic device 100A has been changed as illustrated in FIGS. 11B and 11C, main surfaces of both of the plate-like heat dissipating unit 520 and the plate-like heat receiving unit 510 are positioned substantially parallel to the vertical direction G.

Even though the orientation of the electronic device 100A has been changed, the connection between a vapor pipe 530 and the heat dissipating unit 520 is positioned higher than the connection between a liquid pipe 540 and the heat receiving unit 510 and higher than the connection between the liquid pipe 540 and the heat dissipating unit 510 in the vertical direction G, as before the change of the orientation of the electronic device 100A.

In other words, as illustrated in FIGS. 11A, 11B and 11C, the connection between the vapor pipe 530 and the vapor-pipe connecting tank unit 521 of the heat dissipating unit 520 is positioned higher than the connection between the liquid pipe 540 and the liquid-pipe connecting tank unit 512 of the heat receiving unit 510 in the vertical direction G. Additionally, the connection between the vapor pipe 530 and the vapor-pipe connecting tank unit 521 of the heat dissipating unit 520 is positioned higher than the connection between the liquid pipe 540 and the liquid-pipe connecting tank unit 522 of the heat dissipating unit 520 in the vertical direction G.

Accordingly, even when the orientation of the electronic device 100A has been changed, the coolant COO in the cooling unit 500A can be smoothly circulated between the heat receiving unit 510 and the heat dissipating unit 520 in the same way as before the change of the orientation of the electronic device 100A. Specifically, the coolant COO which has been vaporized in the heat receiving unit 510 by heat from the heat generating component 220 smoothly flows through the vapor-pipe connecting tank unit 511 upward in the vertical direction G. The vaporized coolant COO flowing in the vapor-pipe connecting tank unit 511 upward in the vertical direction G also flows into the connecting pipe units 513 one after another. During this period of time, heat-receiving-unit fin units 514 receive heat from the heat generating component 220 which is contained in warm air.

The vaporized coolant COO which has gathered at the top of the heat receiving unit 510 in the vertical direction G flows through the vapor pipe 530 smoothly into the vapor-pipe connecting tank unit 521 of the heat dissipating unit 520. Then the coolant COO which has condensed and liquefied in the heat dissipating unit 520 flows from the vapor-pipe connecting tank unit 521 downward in the vertical direction G through the connecting pipe units 523 to the liquid-pipe connecting tank unit 522. During this period of time, heat-dissipating-unit fin units 524 radiate heat from the coolant COO flowing in the connecting pipe units 523 downward to dissipate heat contained in the coolant COO (heat from the heat generating component 220).

The coolant COO which has flowed in the heat dissipating unit 520 downward in the vertical direction G then flows through the liquid pipe 540 into the heat receiving unit 510. Then the process described above is repeated.

The configuration and operation of the cooling unit 500A when the orientation of the electronic device 100A has been changed have been described so far.

The electronic device 100A in the second exemplary embodiment of the present invention has effects similar to those of the electronic device 100 in the first exemplary embodiment.

In the electronic device 100A in the second exemplary embodiment of the present invention, the enclosure 300A includes a heat-generating-component housing chamber 300c, an air guide chamber 300d, an enclosure partition 310, a warm air outlet 320 (first opening), a cool air inlet 330 (second opening), and communicating holes 360a, 360b (third opening). The heat-generating-component housing chamber 300c houses a heat generating component 220. The air guide chamber 300d forms an air flow path between the heat-receiving-unit housing chamber 400a and the heatgenerating-component housing chamber 300c. The enclosure partition 310 is provided between the heat-generating-component housing chamber 300c and the air guide chamber 300d and separates the heat-generating-component housing chamber 300c from the air guide chamber 300d. The warm air outlet 320 communicates between the heat-generating-component housing chamber 300c and the heat-receiving-unit housing chamber 400a. The cool air inlet 330 communicates between the heat-receiving-unit housing chamber 400a and the air guide chamber 300d. Communicating holes 360a, 360b are formed in the enclosure partition 310 and communicate between the heat-generating-component housing chamber 300c and the air guide chamber 300d. An air flow path is formed through which air circulates among the heat-generating-component housing chamber 300c, the heat-receiving-unit housing chamber 400a, and the air guide chamber 300d through the warm air outlet 320, the cool air inlet 330, and the communicating holes 360a, 360b. The guide duct unit 340 includes a portion of the enclosure partition 310.

In this way, in the electronic device 100A, the enclosure partition 310 is used to divide the enclosure 300A into two chambers: the heat-generating-component housing chamber 300c and the air guide chamber 300d. Furthermore, the warm air outlet 320, the cool air inlet 330, and the communicating holes 360a, 360b are formed in the enclosure 300A. This enables air to be smoothly circulated among the heat-generating-component housing chamber 300c, the heat-receiving-unit housing chamber 400a and the air guide chamber 300d. Furthermore, since a portion of the enclosure partition 310 is used to form the guide duct unit 340, the number of parts can be reduced.

The present invention has been described with reference to exemplary embodiments thereof. The exemplary embodiments are illustrative and various modifications, additions, omissions, and combinations may be made to the exemplary embodiments described above without departing from the spirit of the present invention. It will be understood by those skilled in the art that variations with such modifications, additions, omissions, and combinations are also fall within the scope of the present invention.

All or part of the first and second exemplary embodiments disclosed above can be described as, but not limited to, the following supplementary notes.

[Supplementary Note 1]

An electronic device comprising:

an electronic board on which a heat generating component is mounted;

an enclosure housing the electronic board;

a heat transport unit coupled to the enclosure and transporting heat from the heat generating component to the outside;

a heat receiving unit provided in the heat transport unit and receiving heat from the heat generating component;

a heat dissipating unit provided in the heat transport unit in such a manner that a portion of the heat dissipating unit is exposed to outside air, the heat dissipating unit being coupled to the heat receiving unit and dissipating heat received by the heat receiving unit to the outside; and a guide duct unit formed by interconnecting the heat generating component and the heat receiving unit in a tubular form in order to send heat from the heat generating component to the heat receiving unit.

[Supplementary Note 2]

The electronic device according to Supplementary Note 1, including:

a heat-receiving-unit housing chamber provided in the heat transport unit and housing the heat receiving unit;

a heat-dissipating-unit housing chamber provided in the heat transport unit and housing the heat dissipating unit; and a heat transport partition provided between the heat-receiving-unit housing chamber and the heat-dissipating-unit housing chamber to prevent air from flowing back and forth between the heat-receiving-unit housing chamber and the heat-dissipating-unit housing chamber.

[Supplementary Note 3]

The electronic device according to Supplementary Note 2, wherein the heat transport partition is disposed so that air containing heat from the heat generating component passes through the heat receiving unit and then flows back into the enclosure.

[Supplementary Note 4]

The electronic device according to Supplementary Note 2 or 3, wherein the heat-dissipating-unit housing chamber includes a heat dissipating opening for providing air outside the heat transport unit to the heat dissipating unit; and air outside the heat transport unit flowing through the heat dissipating opening flows along the heat transport partition into the heat dissipating unit.

[Supplementary Note 5]

The electronic device according to any one of Supplementary Notes 2 to 4, wherein the heat transport unit includes a holder provided along a periphery of the heat receiving unit and holding the periphery of the heat receiving unit; and the holder is provided to prevent passage of air between the periphery of the heat receiving unit and the heat transport partition and between the periphery of the heat receiving unit and an inner wall of the heat transport unit.

[Supplementary Note 6]

The electronic device according to any one of Supplementary Notes 2 to 5, wherein the heat transport partition is formed into a wavy plate.

[Supplementary Note 7]

The electronic device according to any one of Supplementary Notes 1 to 6, including a connector unit connected to the electronic board and exposed outside the enclosure, wherein the connector unit is covered with the heat transport unit.

[Supplementary Note 8]

The electronic device according to any one of Supplementary Notes 1 to 7, wherein the enclosure includes:

a heat-generating-component housing chamber housing the heat generating component;

an air guide chamber forming an air flow path between the heat-receiving-unit housing chamber and the heat-generating-component housing chamber;

an enclosure partition provided between the heat-generating-component housing chamber and the air guide chamber and separating the heat-generating-component housing chamber from the air guide chamber;

a first opening communicating between the heat-generating-component housing chamber and the heat-receiving-unit housing chamber;

a second opening communicating between the heat-receiving-unit housing chamber and the air guide chamber; and a third opening formed in the enclosure partition and communicating between the heat-generating-component housing chamber and the air guide chamber;

an air flow path is formed through which air circulates among the heat-generating-component housing chamber, the heat-receiving-unit housing chamber and the air guide chamber through the first opening, the second opening and the third opening; and the guide duct unit includes a portion of the enclosure partition.

[Supplementary Note 9]

The electronic device according to any one of Supplementary Notes 1 to 8, including a fan unit provided in the electronic-board housing chamber, wherein the fan unit accelerates flow of heat from the heat generating component into the guide duct unit.

[Supplementary Note 10]

The electronic device according to any one of Supplementary Notes 1 to 9, wherein the heat transport unit includes coolant circulating between the heat receiving unit and the heat dissipating unit;

the heat receiving unit receives heat from the heat generating component and transfers the received heat to the coolant; and the heat dissipating unit condenses the coolant flowing from the heat receiving unit.

[Supplementary Note 11]

The electronic device according to Supplementary Note 10, including:

a vapor pipe interconnecting the heat receiving unit and the heat dissipating unit and transporting coolant vaporized in the heat receiving unit from the heat receiving unit to the heat dissipating unit; and a liquid pipe interconnecting the heat receiving unit and the heat dissipating unit and transporting coolant condensed and liquefied in the heat dissipating unit from the heat dissipating unit to the heat receiving unit;

wherein a connection between the vapor pipe and the heat dissipating unit is positioned higher in a vertical direction than a connection between the liquid pipe and the heat receiving unit; and the connection between the vapor pipe and the heat dissipating unit is positioned higher in the vertical direction than a connection between the liquid pipe and the heat dissipating unit.

[Supplementary Note 12]

A cooling system including:

an enclosure housing the electronic board on which a heat generating component is mounted;

a heat transport unit coupled to the enclosure and transporting heat from the heat generating component to the outside;

a heat receiving unit provided in the heat transport unit and receiving heat from the heat generating component;

a heat dissipating unit provided in the heat transport unit in such a manner that a portion of the heat dissipating unit is exposed to outside air, the heat dissipating unit being coupled to the heat receiving unit and dissipating heat received by the heat receiving unit to the outside; and a guide duct unit formed by interconnecting the heat generating component and the heat receiving unit in a tubular form in order to send heat from the heat generating component to the heat receiving unit.

This application is based upon and claims the benefit of priority from Japanese Patent Application No. 2013-035781 filed on Feb. 26, 2013, the entire disclosure of which is incorporated herein.

INDUSTRIAL APPLICABILITY

The present invention is applicable to, for example, electronic devices and the like that include a structure dissipating heat from an electronic board on which heat generating components are mounted.

REFERENCE SIGNS LIST 100, 100A . . . Electronic device
200, 200A . . . Electronic board
210, 210A . . . Substrate
220 . . . Heat generating component
230a, 230b . . . Memory
240 . . . HDD
250 . . . Heat-generating-component fan unit
300 . . . Enclosure
300a . . . Electronic-board housing chamber
300b . . . Air guide chamber
310 . . . Enclosure partition
320 . . . Warm air outlet
330 . . . Cold air inlet
340 . . . Guide duct unit
350 . . . Air guide fan unit
360a, 360b . . . Communicating hole
400, 400A, 400B, 400C . . . Heat transport unit
400a . . . Heat-receiving-unit housing chamber
400b . . . Heat-dissipating-unit housing chamber
420, 420A . . . Cooling unit enclosure
421 . . . Heat dissipating opening
430 . . . Heat transport partition
440 . . . Heat receiving unit holder
450 . . . Heat dissipating fan unit
500 . . . Cooling unit
510 . . . Heat receiving unit
511 . . . Vapor-pipe connecting tank unit
512 . . . Liquid-pipe connecting tank unit
513 . . . Connecting pipe unit
520 . . . Heat dissipating unit
521 . . . Vapor-pipe connecting tank unit
522 . . . Liquid-pipe connecting tank unit
523 . . . Connecting pipe unit
530 . . . Vapor pipe
540 . . . Liquid pipe

The invention claimed is:

1. An electronic device comprising:
an electronic board on which a heat generating component is mounted;
an enclosure housing the electronic board;
a heat transport unit coupled to the enclosure and transporting heat from the heat generating component to the outside;
a heat receiving unit provided in the heat transport unit and receiving heat from the heat generating component;
a heat dissipating unit provided in the heat transport unit in such a manner that a portion of the heat dissipating unit is exposed to outside air, the heat dissipating unit being coupled to the heat receiving unit and dissipating heat received by the heat receiving unit to the outside; a guide duct unit formed by interconnecting the heat generating component and the heat receiving unit in a tubular form in order to send heat from the heat generating component to the heat receiving unit;
a heat-receiving-unit housing chamber provided in the heat' transport unit and housing the heat receiving unit;
a heat-dissipating-unit housing chamber provided in the heat transport unit and housing the heat dissipating unit; and
a heat transport partition provided between the heat-receiving-unit housing chamber and the heat-dissipating-unit housing chamber to prevent air from flowing back and forth between the heat-receiving-unit housing chamber and the heat-dissipating-unit housing chamber;
  wherein the heat transport unit comprises a holder provided along a periphery of the heat receiving unit and holding the periphery of the heat receiving unit; and
  the holder is provided to prevent passage of air between the periphery of the heat receiving unit and the heat transport partition and between the periphery of the heat receiving unit and an inner wall of the heat transport unit.

2. The electronic device according to claim 1, wherein the heat transport partition is disposed so that air containing heat from the heat generating component passes through the heat receiving unit and then flows back into the enclosure.

3. The electronic device according to claim 1, wherein the heat-dissipating-unit housing chamber
  comprises a heat dissipating opening for providing air outside the heat transport unit to the heat dissipating unit; and
    air outside the heat transport unit flowing through the heat dissipating opening flowsalong the heat transport partition into the heat dissipating unit.

4. The electronic device according to claim 1, wherein the heat transport partition is formed into a wavy plate.

5. The electronic device according to claim 1, comprising a connector unit connected to the electronic board and exposed outside the enclosure,
  wherein the connector unit is covered with the heat transport unit.

6. The electronic device according to claim 1, wherein the enclosure comprises:
  a heat-generating-component housing chamber housing the heat generating component;
  an air guide chamber forming an air flow path between the heat-receiving-unit housing chamber and the heat-generating-component housing chamber;
  an enclosure partition provided between the heat-generating-component housing chamber and the air guide chamber and separating the heat-generating-component housing chamber from the air guide chamber;
  a first opening communicating between the heat-generating-component housing chamber and the heat-receiving-unit housing chamber;
  a second opening communicating between the heat-receiving-unit housing chamber and the air guide chamber; and a third opening formed in the enclosure partition and communicating between the heat-generating-component housing chamber and the air guide chamber;
  an air flow path is formed through which air circulates among the heat-generating-component housing chamber, the heat-receiving-unit housing chamber and the air guide chamber through the first opening, the second opening and the third opening; and
  the guide duct unit includes a portion of the enclosure partition.

7. The electronic device according to claim 1, comprising a fan unit provided in the electronic-board housing chamber,
  wherein the fan unit accelerates flow of heat from the heat generating component into the guide duct unit.

8. A cooling system comprising:
  an enclosure housing the electronic board on which a heat generating component is mounted;
  a heat transport unit coupled to the enclosure and transporting heat from the heat generating component to the outside;
  a heat receiving unit provided in the heat transport unit and receiving heat from the heat generating component;
  a heat dissipating unit provided in the heat transport unit in such a manner that a portion of the heat dissipating unit is exposed to outside air, the heat dissipating unit being coupled to the heat receiving unit and dissipating heat received by the heat receiving unit to the outside;
  a guide duct unit formed by interconnecting the heat generating component and the heat receiving unit in a tubular form in order to send heat from the heat generating component to the heat receiving unit;
  a heat-receiving-unit housing chamber provided in the heat transport unit and housing the heat receiving unit;
  a heat-dissipating-unit housing chamber provided in the heat transport unit and housing the heat dissipating unit; and
  a heat transport partition provided between the heat-receiving-unit housing chamber and the heat-dissipating-unit housing chamber to prevent air from flowing back and forth between the heat-receiving-unit housing chamber and the heat-dissipating-unit housing chamber;
  wherein the heat transport unit comprises a holder provided along a periphery of the heat receiving unit and holding the periphery of the heat receiving unit; and
  the holder is provided to prevent passage of air between the periphery of the heat receiving unit and the heat transport partition and between the periphery of the heat receiving unit and an inner wall of the heat transport unit.

9. The electronic device according to claim 1, wherein the heat dissipating unit is provided at one of the plurality of end portions of the heat transport unit, one of the plurality of end portions of the heat transport unit being the end portion opposite to the end portion connected to the enclosure housing.

10. The electronic device according to claim 1,
  wherein the heat generating component and the heat transport unit are linearly connected by the guide duct unit.

* * * * *